(12) United States Patent
Miller et al.

(10) Patent No.: US 6,452,531 B1
(45) Date of Patent: Sep. 17, 2002

(54) JITTER AND LOAD INSENSITIVE CHARGE TRANSFER

(75) Inventors: Gerald A. Miller, Hudson, NH (US); Michael C. W. Coln, Lexington, MA (US)

(73) Assignee: Analog Devices, Inc., Norwood, CA (US)

( * ) Notice: Subject to any disclaimer, the term of this patent is extended or adjusted under 35 U.S.C. 154(b) by 0 days.

(21) Appl. No.: 09/385,211

(22) Filed: Aug. 27, 1999

(51) Int. Cl.[7] .............................................. H03M 1/12
(52) U.S. Cl. ...................................... 341/172; 341/154
(58) Field of Search ............................... 341/172, 143, 341/154; 327/551, 554

(56) References Cited

U.S. PATENT DOCUMENTS

| | | | |
|---|---|---|---|
| 4,484,089 A | * 11/1984 | Wiswanathan | 307/297 |
| 5,079,550 A | 1/1992 | Sooch et al. | 341/143 |
| 5,376,936 A | 12/1994 | Kerth et al. | 341/150 |
| 5,608,345 A | * 3/1997 | Macbeth et al. | 327/337 |

OTHER PUBLICATIONS

Bruce P. Del Signore et al., "A Monolithic 20–b DeltaSigma A/D Converter," *IEEE Journal of Solid–State Circuits*, vol. 25, No. 6, Dec. 1990, pp. 1311–1316.

Omid Shoaei et al., "Optimal (Bandpass) Continuous–Time ΣΔ Modulator," *Proceedings of 1994 IEEE International Symposium on Circuits and Systems*, vol. 5 and 6, May 30–Jun. 2, 1994, pp. 489–492.

Rohit Mittal et al., "Low–Power High–Speed Continuous–Time Σ–Δ Modulators," *Proceedings of 1995 IEEE International Symposium on Circuits and Systems*, Apr. 30–May 3, 1995, pp. 183–186.

Donald A. Kerth, et al., "A 120dB Linear Switched–Capacitor Delta–Sigma Modulator," *1994 IEEE International Solid–State Circuits Conference*, Session 11, Paper TP 11.6, Digest of Technical Papers, pp. 156, 157, 196, and 197.

* cited by examiner

*Primary Examiner*—Peguy JeanPierre
(74) *Attorney, Agent, or Firm*—Wolf, Greenfield & Sacks, P.C.

(57) ABSTRACT

Methods and apparatus for jitter and load insensitive charge transfer are disclosed. A quantity of charge is transferred to or from a load during a transfer interval, wherein the charge transferred is significantly insensitive to load characteristics and variations in the transfer interval. A succession of identical or different quantities of charge may be transferred to or from the load during successive transfer intervals. The charge transfer circuit may be employed in mixed switched/continuous-time circuit configurations, and in particular may be used as a unipolar or bipolar one-bit digital-to-analog converter to provide quantized feedback in a sigma-delta analog-to-digital converter circuit configuration. The charge transfer circuit avoids problems of integrating amplifier nonlinearity and input signal distortion in such sigma-delta analog-to-digital converter circuits, and facilitates monolithic fabrication of sigma-delta analog-to-digital converters using standard integrated circuit fabrication techniques.

52 Claims, 14 Drawing Sheets

JITTER AND LOAD INSENSITIVE CHARGE TRANSFER

FIELD OF THE INVENTION

The present invention relates generally to charge transfer in electronic circuits, and more particularly, to methods and apparatus for transferring a quantity of charge to or from a load during a transfer interval, wherein the charge transferred is significantly insensitive to load characteristics and variations in the transfer interval.

BACKGROUND OF THE INVENTION

A variety of applications require a controlled transfer of electrical charge to or from a load. The load may be, for example, an electrical, electronic, or electro-mechanical device. In particular, the load may be a circuit or a portion of a circuit that performs some function based on the transferred charge.

Various charge transfer circuits are known for particular applications. In general, conventional charge transfer circuits employ some type of switching mechanism to control the transfer of charge between the charge transfer circuit and a load in a timed, periodic manner; hence, charge transfer circuits are often conventionally referred to as "switched" circuits. These circuits generally accept or "sample" some form of input, sometimes referred to as a "reference" signal, and transfer a quantum of charge based on the sampled reference signal to or from the load only during particular respective time intervals. Such switched circuits may be contrasted with "continuous-time" circuits, which typically receive one or more continuous-time input signals over longer uninterrupted periods, and continuously provide one or more output signals based on the input signals.

One example of a charge transfer circuit that has been employed in sampled data systems is given by a switched capacitor circuit, as shown in FIG. 1. FIG. 1 shows that a conventional switched capacitor circuit 10 may include a capacitor 12 having a capacitance C, switches S1 and S2, and a charge control circuit 16 having an input to receive a clock signal 18. The clock signal 18 has a period 19 which defines successive timing intervals 21 and 23, during which the charge control circuit 16 operates the switches S1 and S2 in a particular manner.

The switched capacitor circuit 10 shown in FIG. 1 functions generally as follows. During a first time interval 21 defined by the period 19 of the clock signal 18, the charge control circuit 16 operates the switch S1 to connect circuit nodes 20 and 22, and operates the switch S2 to connect circuit nodes 24 and 26, as shown by the dashed lines in FIG. 1. Accordingly, during the first time interval 21, the capacitor 12 is connected between a reference source 14 and a ground potential, and is charged, or "preset," by a reference signal 15 output by the reference source 14. The reference signal 15 may be, for example, a reference voltage $V_{ref}$, in which case the capacitor 12 is preset to have a particular stored charge Q (in coulombs), given by $Q=CV_{ref}$. Hence, this first time interval 21 is often referred to as a "preset" interval. The charge Q stored on the capacitor 12 may be viewed as representing a "sample" of the reference signal 15, namely the voltage $V_{ref}$, taken during the preset interval 21.

During a second time interval 23, also defined by the period 19 of the clock signal 18 and following the first time interval 21, the charge control circuit 16 operates the switch S1 to connect circuit nodes 28 and 22, and operates the switch S2 to connect circuit nodes 24 and 30 (opposite to the switch positions shown by the dashed lines in FIG. 1). Accordingly, during the second time interval 23, the capacitor 12 is disconnected from the reference source 14 and connected to a load 32, whereupon the charge Q stored on the capacitor 12 is transferred between the capacitor and the load. Hence, this second time interval 23 is often referred to as a "transfer" interval, during which the "sample" of the reference voltage $V_{ref}$ in the form of the charge Q is transferred to the load 32.

In the switched capacitor circuit of FIG. 1, the capacitor 12 may be positively or negatively charged by the reference signal 15; in particular, depending on the relative polarities of the capacitor and the reference signal 15, which may be, for example, a positive or negative voltage $\pm V_{ref}$, the capacitor may be charged during the preset interval 21 such that the capacitor may either transfer a charge Q to, or draw a charge Q from, the load 32 during the transfer interval.

Additionally, in the circuit of FIG. 1, the period 19 of the clock signal 18 is preferably chosen so that the preset interval 21 and the transfer interval 23 are long enough to allow the capacitor 12 to be fully charged to $Q=CV_{ref}$, and discharged so as to fully transfer the charge Q to or from a load, during these intervals, respectively. If this were not the case, the charge Q stored on the capacitor 12 during the preset interval 21 likely would be less than $CV_{ref}$, and hence would not represent an accurate sample of the reference signal 15. Moreover, whatever charge Q was in fact stored on the capacitor 12 during the preset interval 21 likely would not be fully transferred to the load during the transfer interval 23 if the period 19 of the clock signal 18 was not sufficiently long, further exacerbating the inaccuracy of the transferred charge as a representation of the sampled reference signal 15. This situation also can lead to an unpredictable transfer of charge to the load in successive periods of the clock signal, in which case the transferred charges may not consistently and accurately reflect the sampled voltage $V_{ref}$ of the reference signal 15 over longer time intervals. Such a dependence of the transferred charge on the period of the clock signal is generally referred to as "jitter sensitivity."

However, as discussed above, if the period 19 of the clock signal 18 is sufficiently long, based on the capacitance C and the reference signal 15 (for example, the voltage $V_{ref}$), the dynamics of the switched capacitor circuit 10, such as the operation of the switches S1 and S2, ideally have no effect on the transfer of the charge Q between the switched capacitor circuit 10 and the load 32. Conventional switched capacitor charge transfer circuits generally are designed with this concept in mind, and thus are relatively insensitive to variations in the period of the clock signal, or "clock jitter." However, other types of conventional charge transfer circuits, such as switched current source charge transfer circuits, are quite sensitive to clock jitter.

While some conventional charge transfer circuits suffer from a problem of clock jitter sensitivity, as discussed above, Applicant has identified that conventional charge transfer circuits generally suffer from other drawbacks that may impede the fabrication of monolithic integrated circuits including switched charge transfer circuits; in particular, such drawbacks may impede the fabrication of monolithic integrated circuits that mix switched charge transfer circuits with continuous-time circuits.

In view of the foregoing, charge transfer methods and apparatus that overcome various drawbacks specifically identified by the Applicant, as discussed in greater detail below, would offer several advantages to the electronics industry, particularly in the area of sampled data systems.

SUMMARY OF THE INVENTION

The present invention is directed to methods and apparatus for jitter and load insensitive charge transfer.

In one embodiment of the invention, a charge transfer circuit to transfer a quantity of charge to or from a load comprises a clock input to receive a clock signal having a period, wherein a portion of the period defines a transfer interval, and at least one reference input to receive at least one reference signal. In this embodiment, the quantity of charge transferred by the charge transfer circuit is based on the at least one reference signal. Additionally, the charge transfer circuit transfers the quantity of charge during the transfer interval such that the quantity of charge is significantly insensitive to variations in the transfer interval and at least some load characteristics.

In another embodiment of the invention, a charge transfer method comprises a step of transferring a quantity of charge to or from a load during a transfer interval, wherein the quantity of charge is significantly insensitive to the transfer interval and at least some load characteristics.

In another embodiment of the invention, an analog to digital converter comprises an error conditioning filter, a comparator, and a quantized feedback filter. The error conditioning filter receives an input signal and a quantized feedback signal at a summing node and outputs a conditioned error signal based on the input signal and the quantized feedback signal. The comparator is responsive to a clock signal, and makes a comparison of the conditioned error signal and a predetermined threshold value. The comparator outputs a digital data stream based on the comparison and the clock signal. The quantized feedback filter receives the digital data stream and the clock signal and outputs the quantized feedback signal, wherein the quantized feedback signal transfers a quantity of charge to and from the summing node based on the digital data stream. The quantity of charge transferred by the quantized feedback filter via the quantized feedback signal is significantly insensitive to variations in a period of the clock signal and a voltage of the summing node.

Other advantages, novel features, and objects of the invention will become apparent from the following detailed description of the invention when considered in conjunction with the accompanying drawings.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing, wherein.

DETAILED DESCRIPTION

Figure 1:
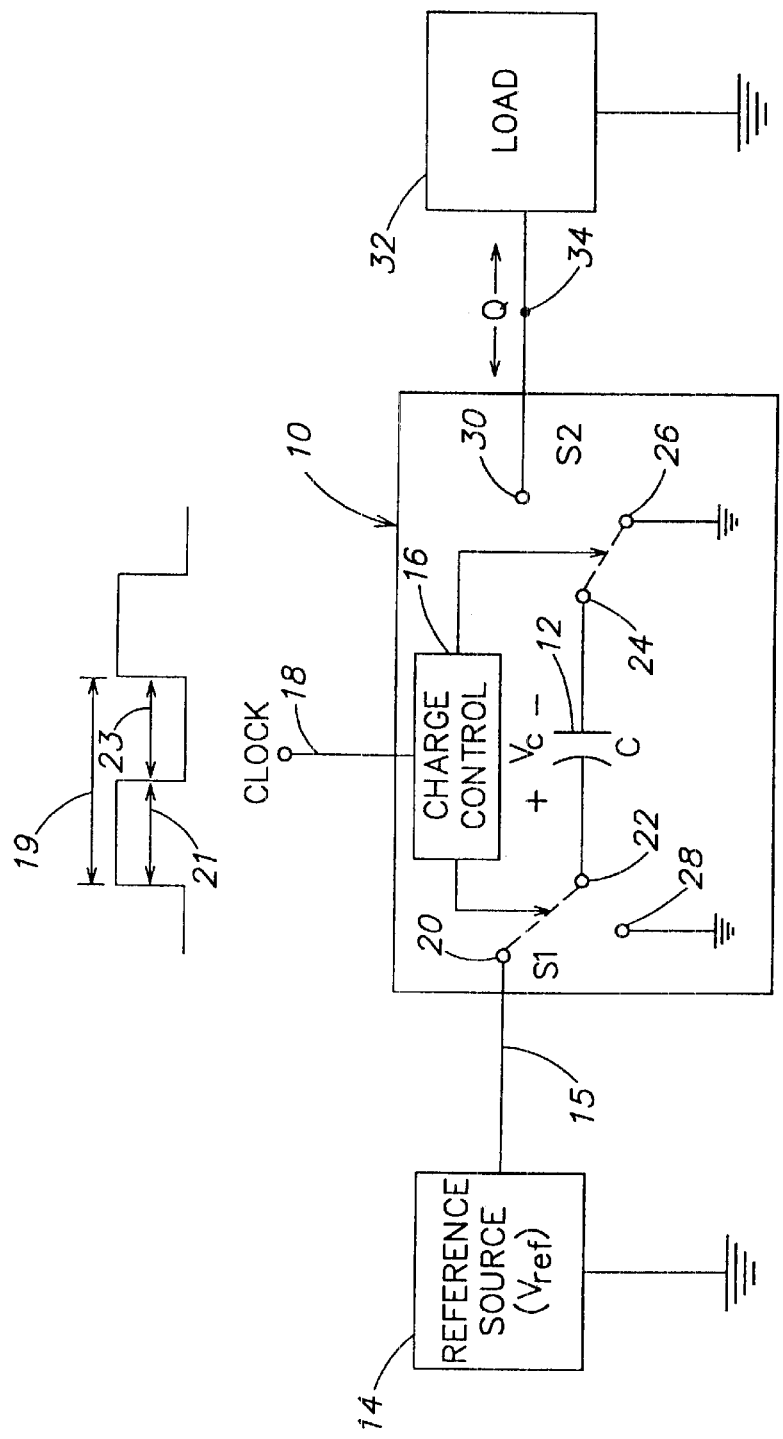
FIG. 1 is a diagram showing a conventional switched capacitor charge transfer circuit.

The present invention is directed to methods and apparatus for jitter and load insensitive charge transfer. The concepts outlined below to transfer charge in a jitter and load insensitive manner according to the invention may be implemented in several ways, and the present invention is not limited to any specific implementation. Some examples of specific implementations of the concepts discussed below are provided for illustrative purposes only. For example, while in one embodiment, an example of an improved switched capacitor circuit is used to illustrate various features of the invention related to jitter and load insensitive charge transfer, such features may be employed in a variety of charge transfer methods and apparatus according to the invention, including methods and apparatus that do not necessarily employ switched capacitor techniques.

According to various embodiments of the invention, a quantity of charge is transferred to or from a load during a transfer interval, wherein the transfer interval is defined by one phase of the period of a clock signal. Generally, the load has certain characteristics associated therewith during at least some portion of the transfer interval, such as, for example, an impedance of the load, a voltage across the load at the time of the charge transfer, other signals coupled to and/or present on the load, or performance limitations associated with any circuitry that may be included in the load. The quantity of charge transferred to or from the load, however, is significantly insensitive to, or independent of, both the transfer interval and at least some, or all, of the load characteristics.

Another phase of the period of the clock signal defines a preset interval, such that the preset interval and the transmit interval do not overlap. Typically, the quantity of charge transferred to or from the load represents a sample of a voltage reference signal output by one or more reference sources. According to various embodiments of the invention, the reference signal is "sampled" during the preset interval, and a quantity of charge representing the sampled reference signal is transferred to or from the load during the transfer interval. In one embodiment, the quantity of charge is transferred in the form of a current pulse having a pulse width that is less than the transfer interval.

According to another embodiment of the invention, one or more reference signals may be sampled and corresponding quantities of charge may be transferred during successive preset and transfer intervals, respectively, such that in one transfer interval charge may be transferred to the load, and in another transfer interval charge may be drawn from the load. Hence, the invention is capable of both "unipolar" and "bipolar" charge transfer. In particular, in one embodiment in which a quantity of charge is transferred in the form of a current pulse, the reference signal determines a maximum amplitude and a polarity of the current pulse, so as to transfer charge to, or draw charge from, the load. In another embodiment, a succession of identical quantities of charge, having different or similar polarities, may be transferred to or from the load during successive transfer intervals.

In another embodiment, a charge transfer circuit according to the invention transfers charge to or from a load that includes a continuous-time circuit, such as an integrator, which may receive one or more continuous-time input signals. Charge transfer circuits have been conventionally employed with continuous-time circuits in applications such as sigma-delta (or delta-sigma) analog-to-digital converters, as described, for example, in "A Monolithic 20-b Delta-Sigma A/D Converter" by Del Signore, et al., *IEEE Journal of Solid State Circuits,* Vol. 25, No. 6, December 1990, pages 1311–1317.

Figure 2:
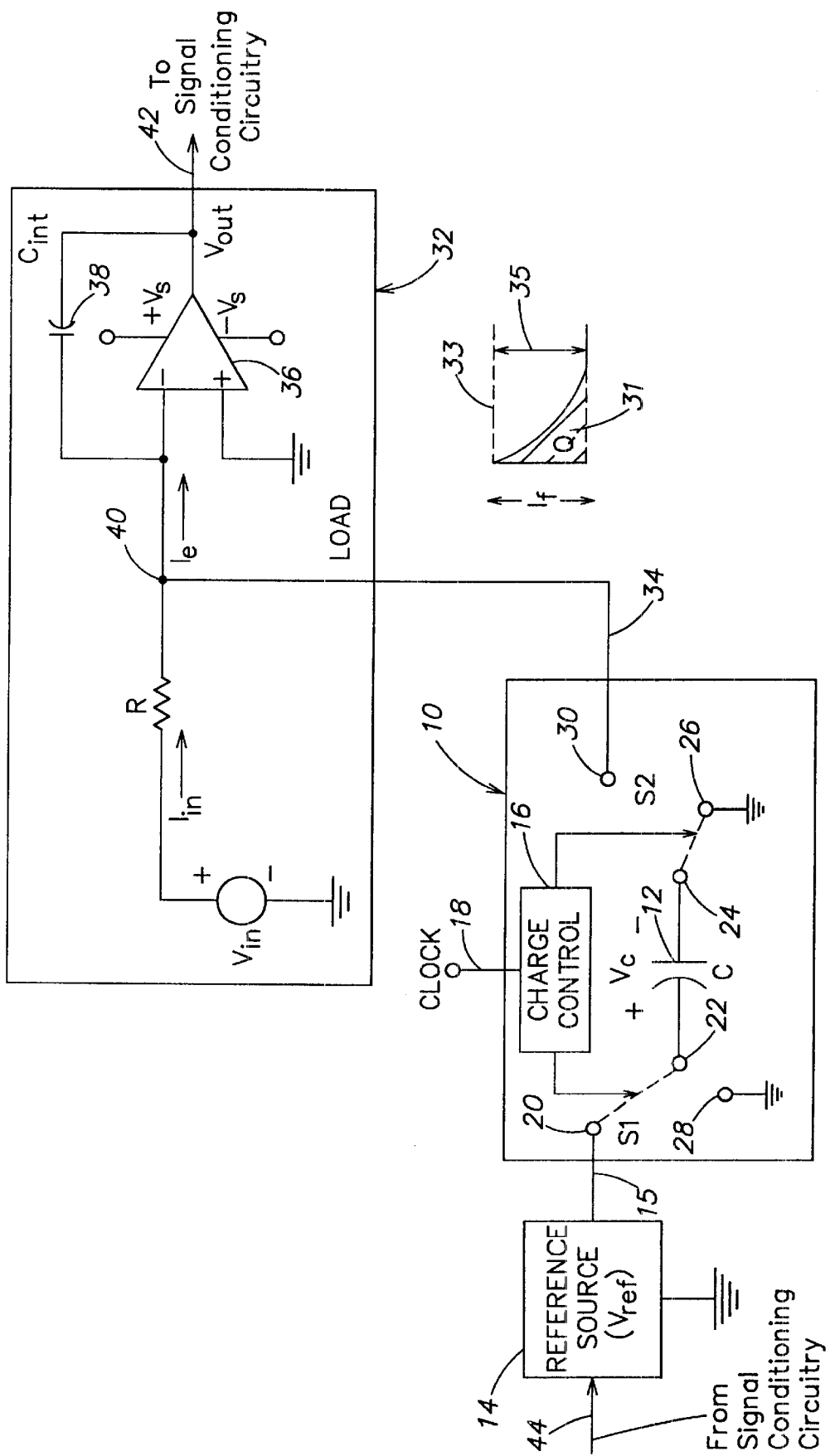
FIG. 2 is a diagram showing a conventional switched capacitor charge transfer circuit employed in a mixed switched/continuous-time circuit configuration.

FIG. 2 illustrates an example of a portion, or "front end," of such a sigma-delta modulator, including a conventional switched capacitor charge transfer circuit 10 as described in connection with FIG. 1. The switched capacitor circuit 10 of FIG. 2 functions essentially as a one-bit digital-to-analog converter, providing a quantized feedback to the modulator in the form of the transferred charge Q.

In the circuit of FIG. 2, a continuous-time input signal $V_{in}$ is applied through a resistor R to an inverting input of an integrating amplifier 36 having a feedback connected integration capacitor 38 ($C_{int}$). An input current $I_{in}$ flows to or from the inverting input of the integrating amplifier 36 based on the input signal $V_{in}$. A charge transfer signal 34 output by the switched capacitor circuit 10, carrying the transferred charge 31 (Q) in the form of a current pulse 33 ($I_f$), is also coupled to the integrating amplifier 36 at summing node 40; accordingly, the circuit of FIG. 2 illustrates a mixed switched continuous-time circuit, wherein the integrating amplifier 36 and the components associated therewith constitute a load 32, to or from which the switched capacitor circuit 10 transfers charge 31. The sum of the continuous-time input current $I_{in}$ and the switched current pulse $I_f$ from the switched capacitor circuit 10 results in an "error" current $I_e$ at the inverting input of the integrating amplifier 36.

Typically, in sigma-delta modulators used in analog-to-digital converters as shown in FIG. 2, an output 42 of the integrating amplifier 36, based on the error current $I_e$, is coupled to various signal conditioning circuitry forming a feedback loop (not shown in FIG. 2). This signal conditioning circuitry in turn provides a digital control signal 44 that controls the reference source 14. While some sigma-delta analog-to-digital converters include a multiple-bit digital control signal, the digital control signal 44 shown in FIG. 2 is treated as a one-bit digital control signal for purposes of illustration in the present discussion.

For example, the digital control signal 44 may control the reference source 14 such that the reference source outputs a reference signal 15 in the form of a voltage $V_{ref}$, or outputs 0 volts, depending on the logic state (high or low) of the digital control signal 44. In this case, the charge transfer circuit 10 outputs a "unipolar" charge transfer signal 34. Alternatively, the digital control signal 44 may control the reference source 14 to output a reference signal 15 having different polarities, for example $+V_{ref}$ or $-V_{ref}$, depending on the state of the digital signal 44. In this case, the capacitor 12 of the switched capacitor circuit 10 may be charged to either a positive or negative voltage $V_c$ depending on the state of the digital control signal 44, such that the current pulse 33 transferring the charge 31 may have a positive or negative polarity; hence, in this case, the charge transfer circuit 10 outputs a "bipolar" charge transfer signal 34.

In FIG. 2, the switched capacitor circuit 10 functions together with the reference source 14 essentially as a one-bit digital-to-analog converter to provide a quantized charge output Q as feedback to the integrating amplifier 36, based on the digital control signal 44. Under normal operating conditions, the digital control signal 44 controls the reference source 14 to output the reference signal 15 so that the flow of the charge 31 (Q) transferred to or from the summing node 40 by the charge transfer signal 34 (in the form of the current $I_f$) is such that the error current $I_e$ averaged over time is approximately zero; namely, $I_{in}+I_f=0$. Accordingly, in this circuit, it is desirable that the charge transfer signal 34, and hence the feedback current $I_f$ (and the transferred charge Q), be dependent only upon the digital control signal 44.

However, conventional sigma-delta analog-to-digital converters, as shown in part in FIG. 2, and more generally, "mixed" electronic circuits having both switched circuit and continuous-time circuit constituents, such as circuits including a variety of switched charge transfer circuits which transfer charge to or from a load that includes a continuous-time circuit, suffer from several drawbacks. For example, in such circuits, the feedback current $I_f$ typically is not only a function of the digital control signal 44, but is undesirably affected by other circuit parameters as well. As discussed above, some switched charge transfer circuits, such as those employing switched current sources, typically suffer from the problem of clock jitter sensitivity, in which the feedback current $I_f$, and hence the transferred charge Q, are sensitive to variations in the period of the clock signal 18.

While other charge transfer circuits, such as the switched capacitor circuit shown in FIGS. 1 and 2, are relatively insensitive to clock jitter, Applicant has nonetheless identified at least two significant problems associated with the mixing of switched circuits and continuous-time circuits in general. In particular, Applicant has realized that various characteristics of the load 32 may adversely impact the accuracy of the charge Q transferred to or from the load. More specifically, in connection with sigma-delta modulators for analog-to-digital converters such as shown in FIG. 2, Applicant has identified that characteristics of the integrating amplifier 36, as well as the input signal $V_{in}$, may undesirably affect the operation of the switched capacitor circuit 10 with the continuous-time integrator circuit serving as the load 32.

For example, a first problem identified by Applicant in connection with the circuit of FIG. 2 is associated with a limited "slew rate" of the integrating amplifier 36. The term "slew rate" conventionally is defined as a maximum rate at which an output of an operational amplifier can change in response to a differential input voltage between non-inverting and inverting inputs of the operational amplifier. The slew rate of an operational amplifier is typically expressed as a maximum time-varying differential output voltage $(dV_{out}/dt)_{max}$, in units of volts/microsecond.

In a typical negative feedback configuration for an operational amplifier, in response to a differential input voltage, the operational amplifier provides an output in an effort to ultimately drive its non-inverting and inverting inputs to essentially the same potential (i.e., eventually drive the differential input voltage to approximately zero volts). In the circuit of FIG. 2, the integrating amplifier 36 includes an integrating capacitor 38, having a capacitance $C_{int}$, in a negative feedback configuration. In the absence of a significant error current $I_e$ at the summing node 40, the inverting input of the amplifier 36 is essentially at or near a ground potential; this condition is due to the non-inverting input of the integrating amplifier 36 being connected to the ground. Practically, however, there is often at least some differential input voltage present at the summing node 40 due to the input signal $V_{in}$.

Accordingly, in FIG. 2, since one terminal of the integrating capacitor 38 is near a ground potential in the absence of a significant error current $I_e$ and another terminal of the integrating capacitor 38 is connected to the output of the amplifier 36, the voltage across the integrating capacitor 38 approximates the output voltage $V_{out}$ of the amplifier 36. Therefore, the differential change in the output voltage $dV_{out}/dt$ of the amplifier 36 may be expressed as $dV_{Cint}/dt = I_e/C_{int}$. It should be appreciated that as long as this differential change in the capacitor voltage $dV_{Cint}/dt = I_e/C_{int}$ remains less than the slew rate of the amplifier 36, or $(dV_{out}/dt)_{max}$, the amplifier 36 remains in a linear region of operation. More specifically, as long as the current $I_e$ remains below some maximum current $I_{max}$ determined by the slew rate of the amplifier 36, given as $(dV_{out}/dt)_{max} = I_{max}/C_{int}$, the amplifier 36 remains In the circuit of FIG. 2, while the capacitor 12 of the switched capacitor circuit 10 is charging during the preset interval, and is accordingly disconnected from the summing node 40, the summing node 40 has a relatively small voltage with respect to the ground potential due to the presence of the input signal $V_{in}$, as discussed above. However, when the charge control circuit 16 of the switched capacitor circuit 10 operates switches S1 and S2 to connect the capacitor 12 to the load 32 during the transfer interval, the voltage $V_c$ across the charged capacitor 12 immediately forces the summing node 40 away from a ground potential; essentially, the entire capacitor voltage $V_c$ is applied between the non-inverting and inverting inputs of the integrating amplifier 36.

Typically, in conventional sigma-delta modulator circuits such as shown in FIG. 2, the slew rate $(dV_{out}/dt)_{max}$ of the integrating amplifier 36 is limited such that the amplifier is incapable of instantaneously responding to the differential input voltage $V_c$. As a result, the amplifier 36 is driven outside of its linear region of operation; namely, the amplitude 35 of the current pulse 33 ($I_f$) is such that the error current $I_e$ is greater than the maximum current capability $I_{max}$ of the amplifier 36, or $I_e/C_{int} > (dV_{out}/dt)_{max}$. The amplitude 35 of the current pulse shown in FIG. 2 is generally determined by a resistance of the switches S1 and S2, which is typically low.

In the circuit of FIG. 2, the integrating amplifier 36 may remain outside of its linear region until the capacitor 12 is almost completely discharged, during which time a significant differential input voltage may remain at the summing node 40. Accordingly, while the amplifier 36 remains outside of its linear region, the current $I_{in}$ delivered through the resistor R is a distorted representation of the input signal $V_{in}$; thus, this condition results in a nonlinear distortion of the input signal $V_{in}$. In particular, the error current $I_e$ includes the inaccurate representation of the input signal $V_{in}$, and hence the output signal 42 of the amplifier "injects" an unpredictable and nonlinear error into the signal conditioning loop.

The foregoing problem associated with a limited slew rate and a nonlinear distortion of the input signal $V_{in}$ places stringent requirements on an operational amplifier to be used as the integrating amplifier 36 in the circuit of FIG. 2. For example, to somewhat mitigate the problem discussed above, an operational amplifier need have a very high slew rate and bandwidth to minimize the time which it may spend out of its linear region when the switched capacitor circuit 10 is switched to the summing node 40.

It should be appreciated that both of these requirements for an operational amplifier serving as the integrating amplifier 36 make a monolithic integrated circuit version of the circuit of FIG. 2 and, in particular, sigma-delta analog-to-digital converters in general, difficult to implement. For example, fabrication processes which may optimize the integrating amplifier 36 by meeting the stringent requirements discussed above are expensive and not well-suited to the fabrication of other components of the circuit, such as resistors, capacitors, switch control circuitry, and the like, which may be fabricated using standard low-cost integrated circuit fabrication techniques. Accordingly, conventional mixed switched/continuous-time circuits, such as the sigma-delta analog-to-digital converter illustrated in part in FIG. 2, have been realized only in discrete versions.

It should also be appreciated, however, that while discrete versions of the circuit of FIG. 2 attempt to address the problem of nonlinear distortion of the input signal $V_{in}$ by optimizing the slew rate and bandwidth of the integrating amplifier 36, these parameters are still limited; hence, such discrete versions may provide improved performance to some extent, but do not necessarily provide a solution to the problem of nonlinear distortion.

A second problem identified by Applicant in connection with the circuit of FIG. 2 is associated with the simultaneous connection of the switched capacitor circuit 10 and the continuous-time input signal $V_{in}$ to the summing node 40. During the transfer interval, once the capacitor 12 discharges to a point at which the integrating amplifier 36 returns to linear operation, the summing node 40 is again essentially at virtual ground. However, the current $I_{in}$ may still be flowing at the summing node 40 due to the presence of an input signal $V_{in}$, which may vary with time. This potentially varying current $I_{in}$ determines a final voltage of the capacitor 12 during the transfer interval, while the capacitor is connected to the summing node 40, and distorts the amount of charge Q ultimately transferred to or from the load 32 by the charge transfer signal 34. In some cases, the capacitor 12 may not be allowed to fully discharge during the transfer interval due to the presence of the input current $I_{in}$. Thus, the charge Q transferred between the switched capacitor circuit 10 and the load 32 may vary with the input current $I_{in}$ and, hence, the analog input signal $V_{in}$. This situation is undesirable, as the transferred charge Q preferably should be a function of only the digital control signal 44, and should be unaffected by other parameters.

As discussed above, in view of both the jitter sensitivity problem and the foregoing problems identified by the Applicant in connection with circuit designs that mix switched charge transfer circuits with continuous-time circuits, monolithically integrated versions of such circuits, and in particular, a sigma-delta analog-to-digital converter employing a switched capacitor charge transfer circuit as shown in FIG. 2, are not presently available. Accordingly, methods and apparatus of the present invention, in various embodiments, are directed to improvements in charge transfer techniques which solve problems associated with conventional circuits and allow low-cost integrated circuit fabrication of mixed switched and continuous-time circuits, while assuring accurate charge transfer that is relatively insensitive to load characteristics and variations in the period of the clock signal which controls the transfer of charge.

Figure 3:
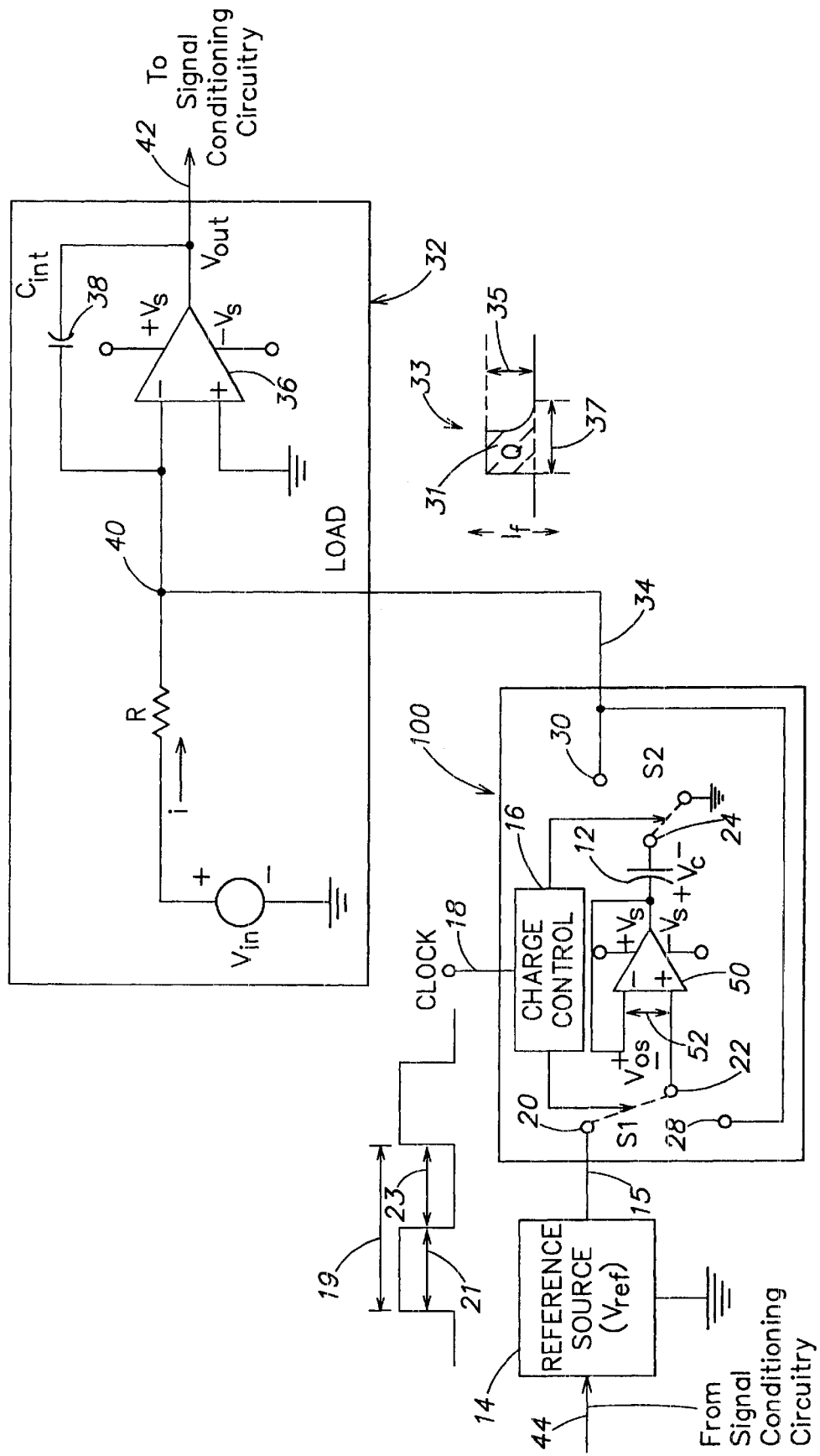
FIG. 3 is a diagram of a charge transfer circuit according to one embodiment of the invention, employed in a mixed switched/continuous-time circuit configuration.

FIG. 3 is a diagram similar to that of FIG. 2 showing a charge transfer circuit 100 according to one embodiment of the invention. In the circuit of FIG. 3, an operational amplifier 50 in a unity gain configuration, or a "buffer" amplifier, is added in series with the capacitor 12. The buffer amplifier 50 limits the maximum amplitude 35 of the current pulse 33 ($I_f$) output by the charge transfer circuit 100 to be less than the maximum current capability $I_{max}$ of the load 32, and in particular, the integrating amplifier 36. Additionally, the buffer amplifier 50 discharges the capacitor 12 during the transfer interval 23 such that the final voltage across the capacitor 12 is significantly independent of the input signal $V_{in}$.

Furthermore, in FIG. 3, the buffer amplifier 50 is designed such that a maximum output current $I_{bufmax}$ of the buffer amplifier 50, when considered in conjunction with an expected range of values for the one or more reference signals 15 and the period 19 of the clock signal 18, allows the capacitor 12 to discharge during the transfer interval 23 so that a pulse width 37 of the current pulse 33 (serving as the charge transfer signal 34) is less than the transfer interval 23. Accordingly, the circuit of FIG. 3 addresses each of the potential problems discussed above in connection with mixed switched/continuous-time circuits; namely, the charge transfer circuit 100 transfers a quantity of charge 31 that is significantly insensitive to variations in the transfer interval 23, or clock jitter, and significantly insensitive to load characteristics, such as, for example, a maximum current capability of any circuitry constituting the load, or a load voltage due to the presence of other signals coupled to the load (such as the input signal $V_{in}$).

In the circuit of FIG. 3, during the preset interval 21, the reference signal 15 charges the capacitor 12 through the buffer amplifier 50 to a voltage of approximately $V_{ref}$. At the end of the preset interval, the charge control circuit 16 operates the switch S2 to disconnect the capacitor 12 from the ground potential, after which the charge control circuit 16 operates the switch S1 to disconnect the non-inverting input of the buffer amplifier 50 from the reference signal 15. Subsequently, at the beginning of the transfer interval 23, the charge control circuit 16 operates both switches S1 and S2 to connect both the capacitor 12 and the non-inverting input of the buffer amplifier 50 to the load 32 and, in particular, to the summing node 40.

As in the circuit of FIG. 2, during the transfer interval the capacitor 12 transfers the charge 31 (Q) to the load 32. However, in the circuit of FIG. 3, unlike the circuit of FIG. 2, the buffer amplifier 50 limits the maximum amplitude 35 of the current pulse 33 on the charge transfer signal 34 so that the transfer of the charge 31 does not cause the integrating amplifier 36 to operate outside of its linear region of operation. In particular, the buffer amplifier 50 is designed to have a maximum current output $I_{bufmax}$ that is less than the maximum current capability $I_{max}$ of the integrating amplifier 36, as defined by the slew rate $(dV_{out}/dt)_{max}=I_{max}/C_{int}$ of the amplifier 36.

In FIG. 3, during the transfer interval 23, the capacitor 12 is placed across the non-inverting and inverting inputs of the buffer amplifier 50; accordingly, the voltage $V_c$ across the capacitor 12 provides a significant differential input voltage to the buffer amplifier 50 and drives the amplifier 50 outside of its linear region of operation. While this condition is typically undesirable for the integrating amplifier 36, according to the embodiment of FIG. 3 the buffer amplifier 50 is purposefully designed to advantageously operate in both its linear and nonlinear region by predictably responding to the significant differential input voltage from the capacitor 12.

For example, the buffer amplifier 50 in the circuit of FIG. 3 may be particularly designed as an operational transconductance amplifier (voltage-to-current amplifier), in which the differential input voltage $V_c$ initially forces the buffer amplifier 50 to deliver a maximum output current $I_{bufmax}$ to the load 32 through the capacitor 12. In general, as a transconductance amplifier, the buffer amplifier 50 acts as a controllable current source, outputting a current based on the differential input voltage, wherein the output current has a maximum value of $I_{bufmax}$.

In the embodiment of the invention shown in FIG. 3, the buffer amplifier 50 is designed so that its maximum output current $I_{bufmax}$ is less than the maximum current capability $I_{max}$ of the integrating amplifier 36, by at least an amount equal to or greater than an expected range of values for the input current $I_{in}$ due to the input signal $V_{in}$. Accordingly, a rate of change of the output signal 42 of the integrating amplifier 36, given as $dV_{out}/dt=(I_{bufmax}+I_{in})/C_{int}$, remains less than the slew rate $(dV_{out}/dt)_{max}=I_{max}/C_{int}$ of the amplifier 36, and the amplifier 36 (and hence the sigma-delta modulator) responds linearly to the input signal $V_{in}$.

For circuit power supply voltages $\pm V_s$ of approximately $\pm 5$ volts, an exemplary range of values $\pm V_{ref}$ for the one or more reference signals 15 suitable for purposes of the invention includes, but is not limited to, from $\pm 1$ volt to $\pm 3$ volts. Based on these parameters, for an exemplary capacitance $C_{int}$ of the integrating capacitor 38 equal to approximately 1.5 nanofarads, an example of a slew rate of the integrating amplifier 36 suitable for purposes of the invention includes, but is not limited to, approximately 3 volts/microsecond. Similarly, based on the foregoing parameters, an example of a maximum output current $I_{bufmax}$ for the buffer amplifier 50 suitable for purposes of the invention includes, but is not limited to, approximately 2 milliamps. Such a choice for the current $I_{bufmax}$ results in a differential change in the output signal 42 of the integrating amplifier 36, given as $dV_{out}/dt \approx (I_{bufmax})/C_{int}$, equal to approximately 0.75 volts/microsecond, which is well below the exemplary slew rate of 3 volts/microsecond of the integrating amplifier 36. It should be appreciated that the foregoing parameter values are for purposes of illustration only, and that other values may be suitable according to various embodiments of the invention.

In FIG. 3, during the transfer interval, the capacitor 12 eventually discharges to a point at which the buffer amplifier 50 enters its linear region and outputs a current less than $I_{bufmax}$. The buffer amplifier continues, however, to drive its non-inverting and inverting inputs to essentially the same potential, as discussed above. Since the capacitor 12 is connected across the buffer amplifier's inputs during the transfer interval, the buffer amplifier 50 accordingly operates to discharge the capacitor, irrespective of any signal present at the summing node 40 (to which the capacitor 12 is also connected during the transfer interval). Therefore, in the circuit of FIG. 3, the final voltage of the capacitor 12, and hence the charge 31 transferred by the current pulse 33, is independent of the input signal $V_{in}$.

In sum, the charge transfer circuit 100 according to the embodiment of the invention shown in FIG. 3 addresses and solves both of the problems discussed above in connection with nonlinear distortion of the input signal $V_{in}$ and nonlinear operation of the integrating amplifier 36 in the circuit of FIG. 2, and similar sigma-delta modulators used, for example, in analog-to-digital converters. Accordingly, the charge transfer circuit 100 allows the mixed switched/continuous-time circuit of FIG. 3 and similar circuits, formerly available only in discrete versions, to be monolithically fabricated as an integrated circuit by reducing the requirements of high slew rate and high bandwidth otherwise required of amplifying components in the continuous-time portion of the circuitry, such as the integrating amplifier 36. Additionally, the charge transfer circuit 100 of FIG. 3 overcomes the problem of clock jitter typical of conventional of switched current source charge transfer circuits.

In the circuit of FIG. 3, a small random time-varying offset voltage 52 ($V_{os}$) is typically associated with the buffer amplifier 50, between the inverting and non-inverting inputs of the buffer amplifier 50. It should be appreciated, however, that due to the particular design of the charge control circuit 100 illustrated in FIG. 3, any such offset voltage 52 does not add a significant noise component to the charge 31 ultimately transferred to or from the load 32.

In particular, during the preset interval, in the presence of an offset voltage 52, a charge $Q=CV_c$ is stored in the capacitor 12, wherein the capacitor voltage $V_c$ is equal to ($V_{ref}+V_{os}$). During the transfer interval, the buffer amplifier 50 discharges the capacitor 12 to a final voltage of $V_{os}$, namely, the differential offset voltage 52 between the non-inverting and inverting inputs of the buffer amplifier 50. Accordingly, the charge 31 transferred to or from the load 32 is given by $C(V_{c\_initial}-V_{c\_final})=C([V_{ref}+V_{os}]-V_{os})=CV_{ref}$; therefore, the charge 31 depends primarily on the reference source voltage $V_{ref}$ and not on the offset voltage $V_{os}$. While the offset voltage $V_{os}$ during the preset interval may not be precisely correlated with the offset voltage $V_{os}$ during the transfer interval due to the random time-varying nature of the offset voltage, in general the offset voltage 52 is sufficiently correlated during the preset and transfer intervals so as to substantially "cancel" and, hence, not adversely affect the transfer of the charge 31.

However, for other applications, for example, in which the reference source 14 is replaced by one or more variable continuous-time input voltages V(t) and the charge transfer circuit is employed as a voltage sampler, a common mode rejection (CMR) of the buffer amplifier 50 conventionally associated with typical operational amplifiers may cause $V_{os}$ to vary appreciably during the transfer interval as a function of the sampled signals V(t), possibly in a nonlinear manner. Such a variation in $V_{os}$ may in turn lead to an undesirable nonlinear variation in the transferred charge 31 of the charge transfer circuit 100 shown in FIG. 3.

Figure 4:
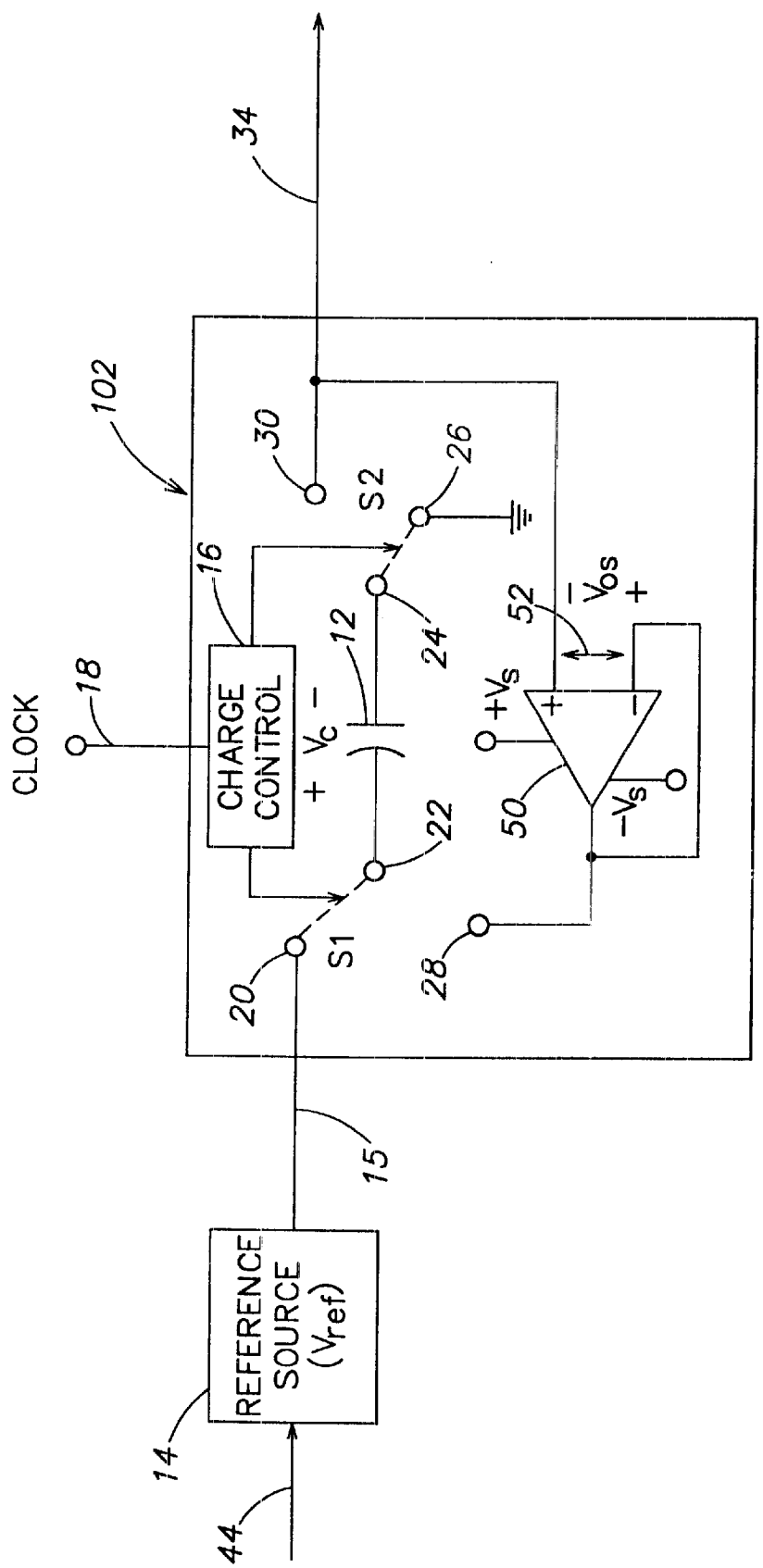
FIG. 4 is a diagram of a charge transfer circuit according to another embodiment of the invention.

In view of the foregoing, FIG. 4 shows a charge transfer circuit 102 according to another embodiment of the invention, in which the capacitor 12 is charged by direct connection to the reference signal 15, and is discharged through the buffer amplifier 50 in a manner similar to that described in connection with FIG. 3. While the circuit of FIG. 4 is nonetheless useful as a charge transfer circuit in the sigma-delta modulator shown in FIG. 3, as indicated by the reference source 14 in FIG. 4, the circuit of FIG. 4 may be adapted to sample continuous-time voltage signals V(t), in place of one or more fixed reference signals 15, without nonlinear distortion in the transferred charge, as discussed above. In the embodiment of FIG. 4, the transferred charge 31 includes a fixed "noise" component $Q_{noise}=CV_{os}$ incurred during the transfer interval, but no nonlinear distortion terms are added to the transferred charge as a result of varying continuous-time input signals V(t) or offset voltages.

With reference to FIG. 4, during the preset interval, the charge control circuit 16 operates the switches S1 and S2 to connect the circuit nodes 20 and 22, and 24 and 26, respectively, as shown by the dashed lines in FIG. 4. Accordingly, the capacitor 12 charges by direct connection to the reference signal 15 or, alternatively, a varying input voltage V(t). During the transfer interval, the charge control circuit 16 operates the switches S1 and S2 to connect the circuit nodes 22 and 28, and 24 and 30, respectively, and the capacitor 12 is placed across the non-inverting and inverting inputs of the buffer amplifier 50 and discharges through the amplifier 50, in a manner similar to that discussed above in connection with FIG. 3.

In FIG. 4, while the offset voltage 52 of the amplifier 50 does not affect the charging of the capacitor 12 during the preset interval, the capacitor 12 discharges to a voltage $V_c=V_{os}$ during the transfer interval, thereby introducing the "noise" component $Q_{noise}$ in the transferred charge 31 carried by the charge transfer signal 34. However, this noise component is merely a minor tradeoff for the advantage of no nonlinear distortion of the transferred charge 31, for applications in which the charge transfer circuit 102 operates as a sampler for varying continuous-time input voltages V(t).

It should be appreciated that the embodiments of FIGS. 3 and 4 show merely two exemplary implementations of a charge transfer circuit according to the invention, and different implementations are possible. Additionally, while FIG. 3 shows the charge transfer circuit 100 employed in a portion of a sigma-delta modulator circuit used, for example, in an analog-to-digital converter, both the charge transfer circuits shown in FIGS. 3 and 4 may by employed in other applications, for example voltage samplers, as discussed above in connection with FIG. 4.

Moreover, while the summing node 40 of the load 32 shown in FIG. 3 essentially provides a low impedance to the charge transfer signal 34 output by the charge transfer circuits 100 or 102, charge transfer circuits according to other embodiments of the invention may be designed specifically to drive higher impedance loads, as discussed below in connection with FIG. 14. Accordingly, it should be appreciated that charge transfer circuits according to various embodiments of the invention are not limited to the specific implementations shown in FIGS. 3 and 4. Additionally, various modifications to the implementation shown in FIGS. 3 and 4 are considered to be within the spirit and scope of the invention.

For example, in the embodiments of both FIGS. 3 and 4, while the preset interval 21 is shown as the positive half cycle of the period 19 of the clock signal 18, and the transfer interval 23 is shown as the negative half cycle of the period 19, an alternate arrangement in which the negative half cycle of the period 19 serves as the preset interval and the positive half cycle serves as the transfer interval would also be suitable for charge control circuits according to various embodiments of the invention. Additionally, while the preset and transfer intervals 21 and 23 are shown as approximately equal in duration in FIG. 3, these intervals may have different durations relative to each other, and are shown as approximately equal in FIG. 3 for purposes of illustration only. Various timing aspects of the invention are discussed in greater detail further below, in connection with FIG. 11.

Additionally, in the embodiments of both FIGS. 3 and 4, while the charge control circuit 16 and the switches S1 and S2 are shown symbolically as discrete components in the figures for ease of illustration, it should be appreciated that various circuit components and arrangements of components for the charge control circuit 16 and the switches S1 and S2 are suitable for purposes of the invention. For example, the switches S1 and S2 may each be formed by one or more MOS transistors to which the clock signal 18 is coupled. Similarly, the charge control circuit 16 may include one or more transistors and/or other logic components or circuitry to couple the clock signal 18 to the switches so as to appropriately operate the switches during respective preset and transfer intervals. Moreover, according to at least one embodiment of the invention, any components constituting the switches S1 and S2 as well as the charge control circuit 16 may be fabricated using standard integrated circuit fabrication techniques, so as to facilitate the fabrication of a monolithic integrated circuit version of the circuits shown in FIGS. 3 and 4.

Additionally, while FIGS. 3 and 4 each show only one capacitor 12 in the respective charge control circuits 100 and 102, according to another embodiment of the invention the capacitor 12 may be replaced by a charge storage circuit that includes one or more capacitors and/or other components arranged in a variety of configurations, to store a quantity of charge based on one or more reference signals, such as reference signal 15. Similarly, while the buffer amplifier 50 is shown in FIGS. 3 and 4 symbolically as an operational amplifier, according to various embodiments of the invention a variety of components, for example MOS transistors arranged in a variety of configurations, may constitute the buffer amplifier 50. A more detailed discussion of the buffer amplifier 50 follows below, in connection with FIGS. 5 and 6.

Furthermore, as discussed above in connection with FIG. 2, it should be appreciated that according to various embodiments of the invention, as shown for example in FIGS. 3 and 4, the reference source 14 may output one or more reference signals 15 based on the digital control signal 44. For example, while the digital control signal 44 is in one of a logic high or logic low state, the reference source 14 may output a reference voltage signal 15 having a voltage of plus or minus $V_{ref}$ and while the digital control signal 44 is in an opposite state, the reference source 14 may output a reference voltage signal of zero volts. In this case, the charge transfer circuits 100 and 102 act as "unipolar" circuits, in that the charge control signal 34 carrying the transferred charge 31 has one of either a positive or negative polarity during each transfer interval in which charge is transferred to or from the load.

Alternatively, while the digital control signal 44 is in one of a logic high or logic low state, the reference source 14 may output a reference voltage of plus $V_{ref}$, and while the digital control signal 44 is in an opposite state, the reference source 14 may output a reference voltage signal of minus $V_{ref}$. In this case, the charge transfer circuits 100 and 102 act as "bipolar" circuits, in that the charge control signal 34 carrying the transferred charge 31 may have either a positive or negative polarity during each transfer interval in which charge is transferred to the load. Successive quantities of transferred charges 31 of either polarity may be essentially identical in magnitude, based on the magnitude of the reference voltage $\pm V_{ref}$.

Alternatively, the reference source 14 may output positive and negative reference voltages $+V_{ref1}$ and $-V_{ref2}$ having different magnitudes, resulting in quantities of transferred charges having different magnitudes based on their polarity. In yet another embodiment, the reference source may output two or more different reference voltages $V_{ref1}$ and $V_{ref2}$ having either a same or different polarity. From the foregoing, it should be appreciated that the reference source 14 generally may include one or more discrete voltage reference sources capable of outputting one or more fixed or variable reference signals 15 having a variety of magnitudes and different polarities, wherein a selection of a particular reference signal 15 is based at least in part on the digital control signal 44.

Figure 5:
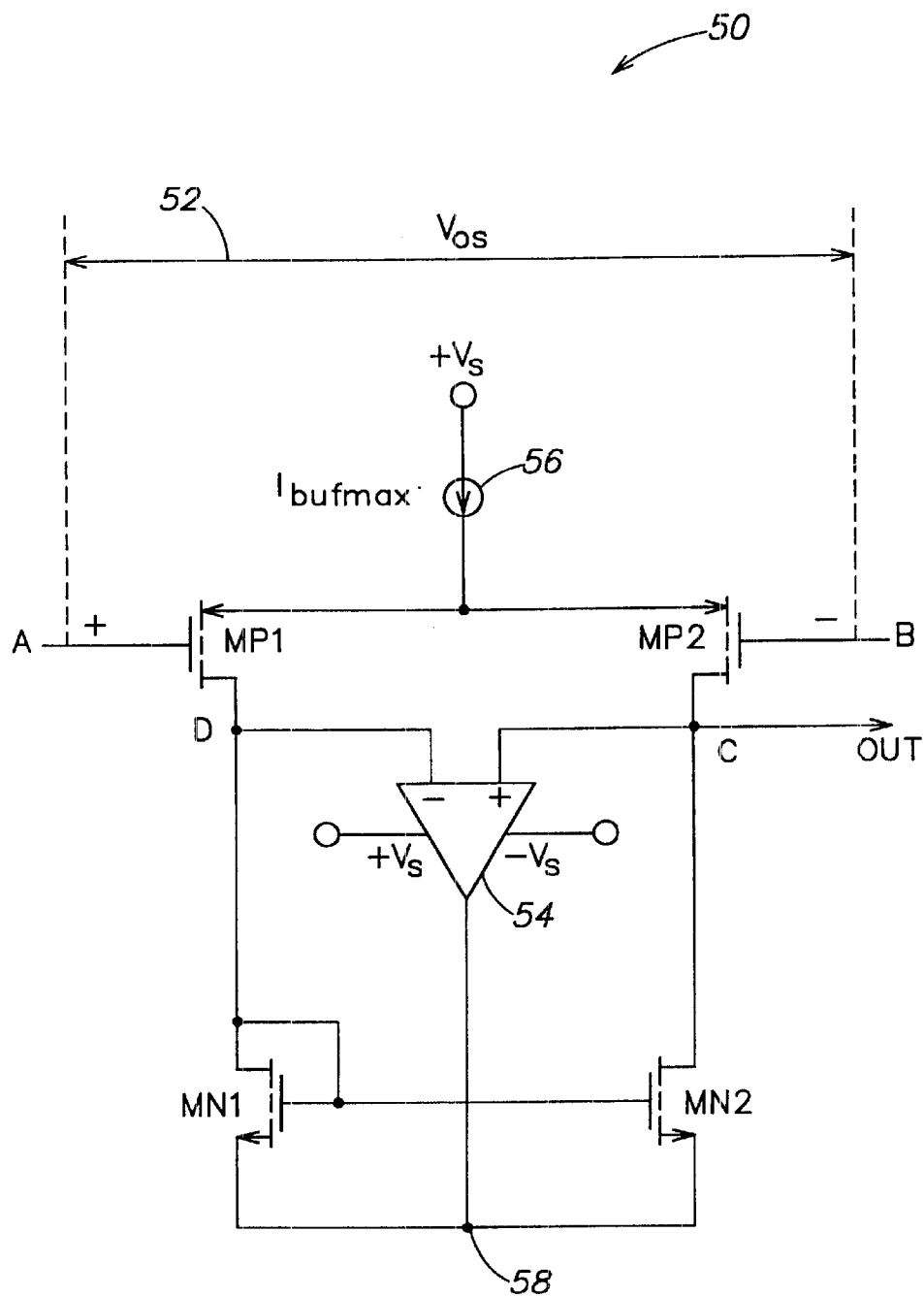
FIG. 5 is a schematic circuit diagram of an example of a buffer amplifier for use in the charge transfer circuits of FIGS. 3 and 4, according to one embodiment of the invention.

FIG. 5 is a schematic circuit diagram of one example of a buffer amplifier 50 suitable for use in the charge transfer circuits 100 and 102 of FIGS. 3 and 4, respectively, according to one embodiment of the invention. Buffer amplifiers similar to the amplifier 50 shown in FIG. 5, which have desirable attributes for integrated circuit fabrication such as simplicity and low power and area requirements, as well as excellent common mode rejection (CMR), are described in "Active Bootstrapped Gain-Enhancement Technique for Low-Voltage Circuits" by E.

Seevinck, et al., *IEEE Trans. Circuits Syst. II*, Vol. 45, September 1998, pp. 1250–1254, herein incorporated by reference.

In the buffer amplifier 50 shown in FIG. 5, terminal A is the non-inverting input, terminal B is the inverting input, and an output of the amplifier 50 is taken at node C. PMOS transistors MP1 and MP2 form a first differential input pair of transistors supplied by current source 56, which is coupled to the positive power supply voltage $+V_s$ and determines the maximum output current $I_{bufmax}$ of the buffer amplifier 50. NMOS transistors MN1 and MN2 form a first current mirror coupled to the differential pair MP1 and MP2. While not explicitly shown in FIG. 5, in more conventional operational amplifier designs that may also be suitable for the buffer amplifier 50 according to some embodiments of the invention, the common sources of MN1 and MN2, indicated by node 58 in FIG. 5, may be coupled directly to the negative power supply voltage $-V_s$.

However, as shown in FIG. 5, the common mode rejection (CMR) of such an operational amplifier may be significantly improved by coupling the current mirror to an internal amplifier 54 in a "bootstrap" configuration, so as to maintain the nodes C and D at essentially the same potential. As a result, any offset voltage 52 ($V_{os}$) between the non-inverting and inverting inputs A and B, respectively, is "fixed" by virtue of the amplifier 54 holding the nodes C and D at essentially the same potential. Thus, with reference again to FIGS. 3 and 4, the circuit configuration of FIG. 5 for the buffer amplifier 50 has the advantage of reducing any noise component in the charge transferred between the reference source 14 and the capacitor 12 during the preset interval, as well as any noise component in the charge transferred between the capacitor 12 and the load 32 during the transfer interval, due to an offset voltage 52 of the buffer amplifier 50.

In another embodiment of the invention particularly suitable for "bipolar" charge transfer applications, the buffer amplifier 50 shown in FIG. 5 may be modified so that it is capable of delivering a quantity of charge to or from a load (transferring a charge having a positive or negative polarity) based upon a single reference voltage $V_{ref}$ having either a positive or negative polarity, rather than two reference voltages having opposite polarities. In this embodiment, with reference again to FIG. 3 or 4, rather than the digital control signal 44 controlling the reference source 14 to output reference signals 15 having different polarities based on the state of the digital control signal 44, a "buffer mode select" signal, derived in part from the digital control signal 44, controls the modified buffer amplifier to appropriately charge a capacitor (or a charge storage circuit) based upon a single reference signal, and discharge the capacitor (or charge storage circuit) so as to either transfer charge to, or draw charge from, a load based on the buffer mode select signal.

Figure 6:
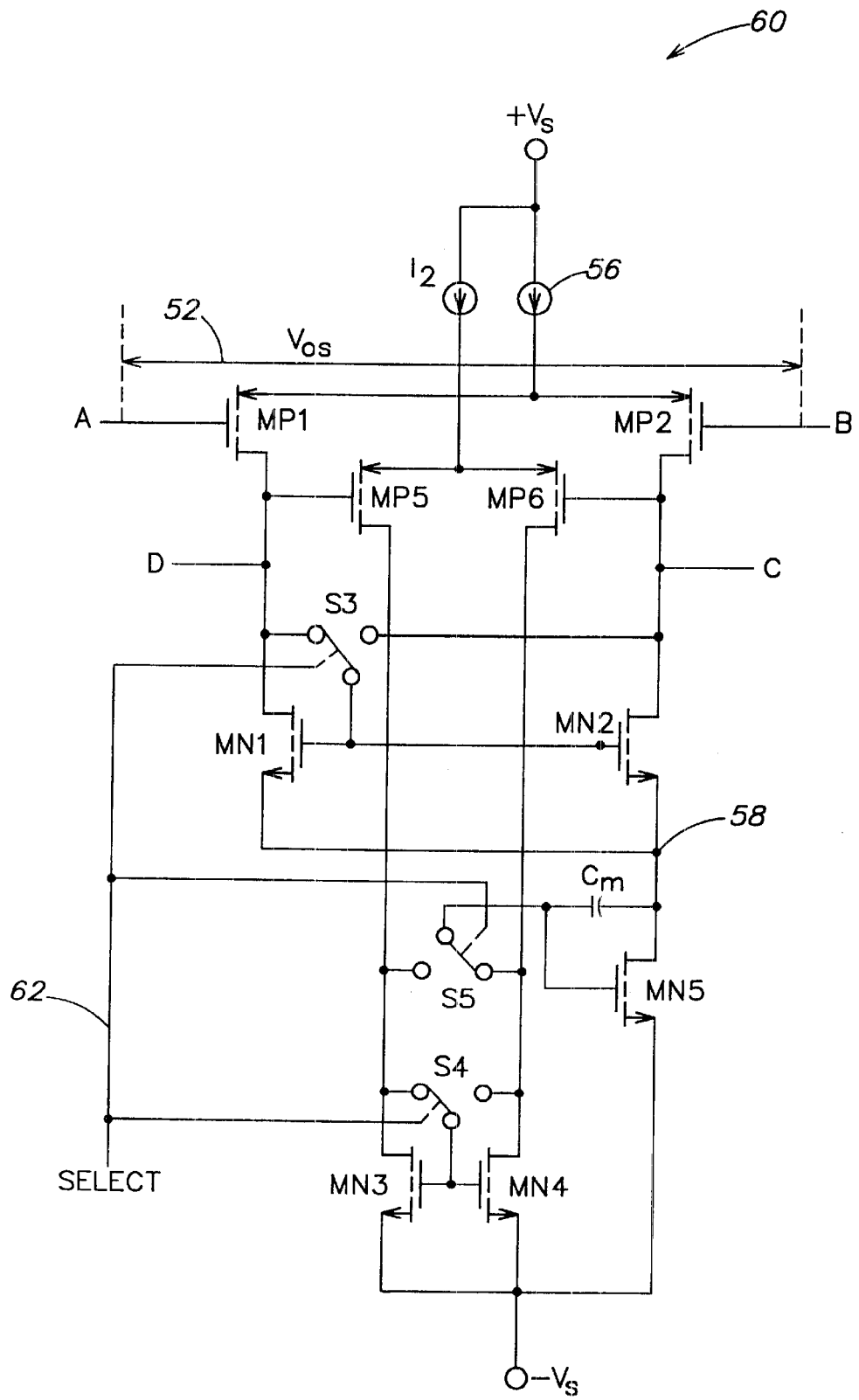
FIG. 6 is a schematic circuit diagram of a modified buffer amplifier based on the buffer amplifier of FIG. 5, according to one embodiment of the invention.

FIG. 6 is a schematic circuit diagram showing a modified buffer amplifier 60 based on the buffer amplifier 50 shown in FIG. 5, according to one embodiment of the invention. In FIG. 6, the internal amplifier 54 of the buffer amplifier 50 shown in FIG. 5 is expanded to reveal a two-stage design; a first stage includes a second differential input pair of PMOS transistors MP5 and MP6 coupled to the nodes D and C, respectively, a current source 12 coupled to the positive supply voltage +$V_s$ and the second differential input pair, and a second current mirror formed by NMOS transistors MN3 and MN4. A second stage of the internal amplifier includes a Miller integrator formed by NMOS transistor MN5 and capacitor $C_m$, from which an output of the internal two-stage amplifier is coupled at the node 58 to the first current mirror formed by NMOS transistors MN1 and MN2.

According to the embodiment of the invention shown in FIG. 6, switches S3, S4, and S5, controlled by a buffer mode select signal 62, are included in the modified buffer amplifier 60 to facilitate bipolar operation of a charge transfer circuit employing the modified buffer amplifier 60, as discussed further below in connection with FIG. 7. In FIG. 6, when the buffer mode select signal 62 is in one of either a high or low logic state, the switches S3, S4, and S5 are connected as shown in FIG. 6, so that the terminals A and B are the non-inverting and inverting inputs, respectively, of the amplifier 60, and the terminal C is the output of the amplifier 60; in essence, when the positions of the switches S3, S4, and S5 are as shown in FIG. 6, the modified buffer amplifier 60 is configured similarly to that of the buffer amplifier 50 shown in FIG. 5.

However, when the buffer mode select signal 62 is in an opposite logic state, the switches S3, S4, and S5 are connected opposite to that shown in FIG. 6; as a result, terminal A becomes the inverting input of the amplifier 60, terminal B becomes the non-inverting input, and terminal D becomes the output of the amplifier 60. In this manner, the modified buffer amplifier 60 is "reconfigurable" based on the buffer mode select signal 62. It should be appreciated that any offset voltage 52 of the modified buffer amplifier 60 remains essentially unchanged between the two amplifier configurations, as the operating conditions of the various components constituting the amplifier 60 are relatively unaffected by the switch positions.

Figure 7:
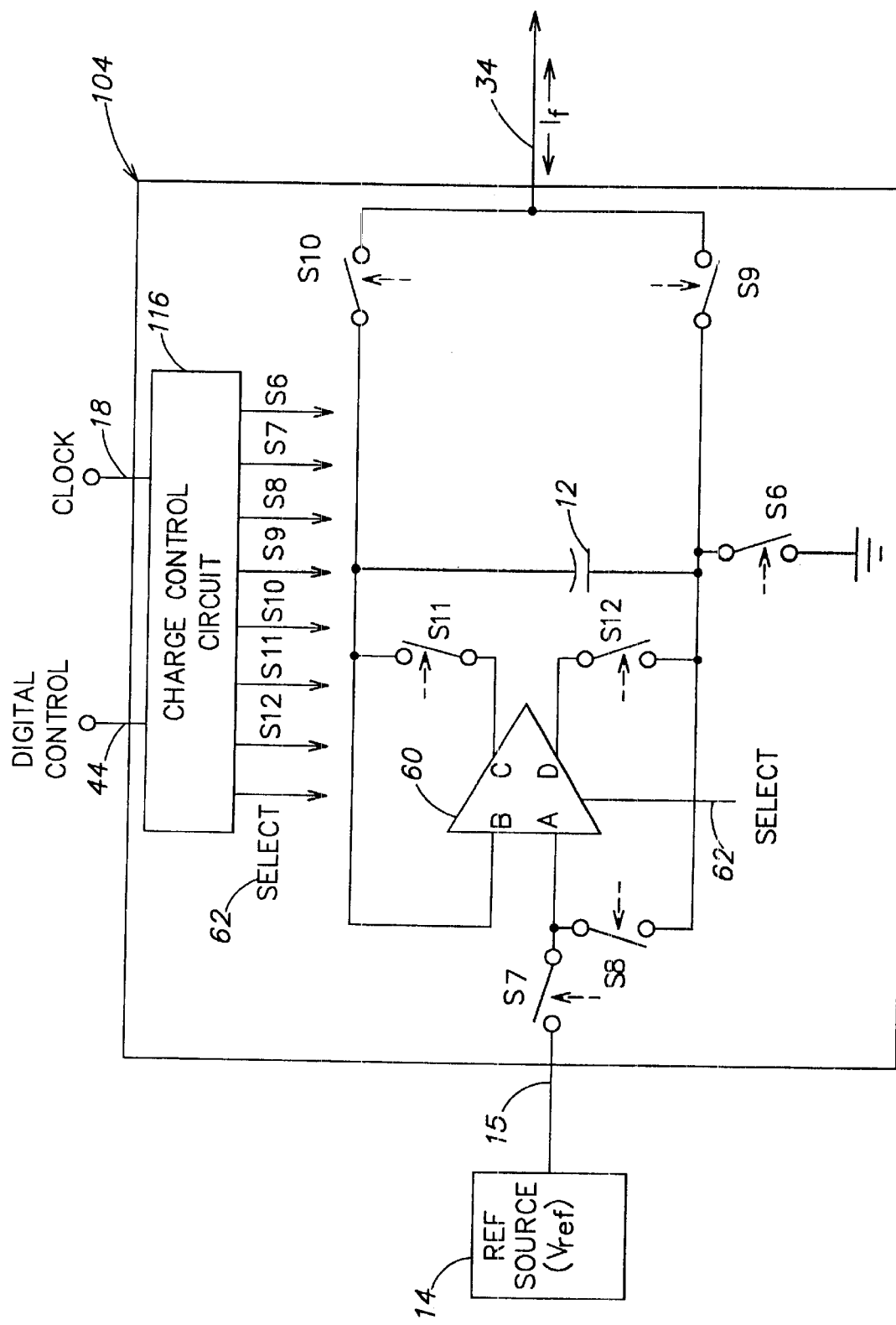
FIG. 7 is a diagram of a charge transfer circuit having a bipolar output and employing the modified buffer amplifier of FIG. 6, according to one embodiment of the invention.

FIG. 7 is a diagram showing a charge transfer circuit 104 employing the modified buffer amplifier 60 of FIG. 6, according to one embodiment of the invention. In FIG. 7, unlike the embodiments of a charge transfer circuit shown in FIGS. 3 and 4, the digital control signal 44 is applied to a charge control circuit 116 as opposed to the reference source 14. The charge control circuit 116 outputs respective control signals to switches S6–S12, as well as the buffer mode select signal 62, in a predetermined manner based on the digital control signal 44 and the clock signal 18. The timing of the signals input to, and output from, the charge control circuit 116 is discussed in greater detail below, in connection with FIG. 11. As in other embodiments, the switches S6–S12 may be implemented as, for example, one or more MOS transistors having their respective gates appropriately coupled to the corresponding control signals output from the charge control circuit 116.

As discussed above, in the embodiment of FIG. 7, during the preset interval the charge control circuit 116 controls the switches S6–S12 so that the modified buffer amplifier 60 charges the capacitor 12 based upon a reference signal 15 having one of either a positive or negative polarity. During the transfer interval, the charge control circuit 116 controls the switches S6–S12 in one of two configurations, based on the state of the digital control signal 44, so as to transfer charge stored in the capacitor 12 between the capacitor 12 and a load from one of two terminals of the capacitor 12, thereby transferring the stored charge either to or from the load via the charge transfer signal 34. In this manner, the charge transfer circuit 104 provides a bipolar charge transfer signal 34 based on only one (or a unipolar) reference signal 15.

Figure 8:
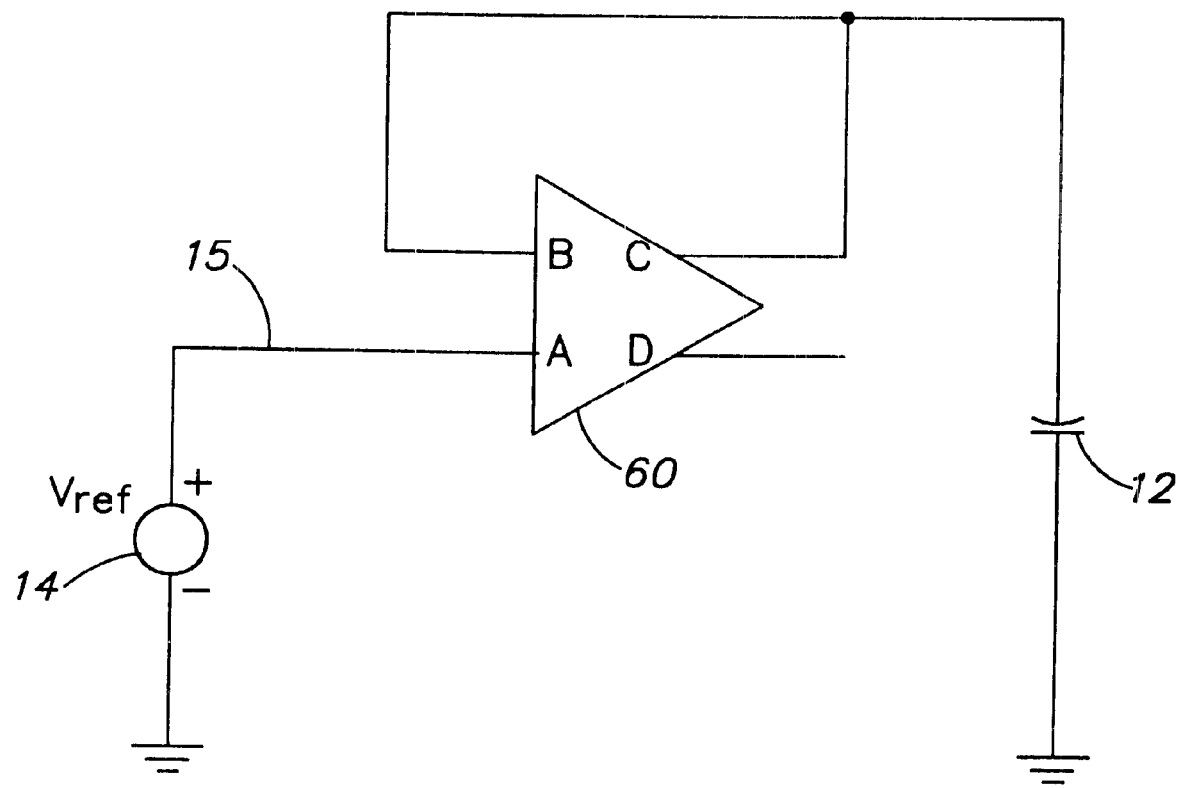
FIGS. 8–10 are diagrams showing various operating modes for the charge transfer circuit of FIG. 7.
Figure 9:
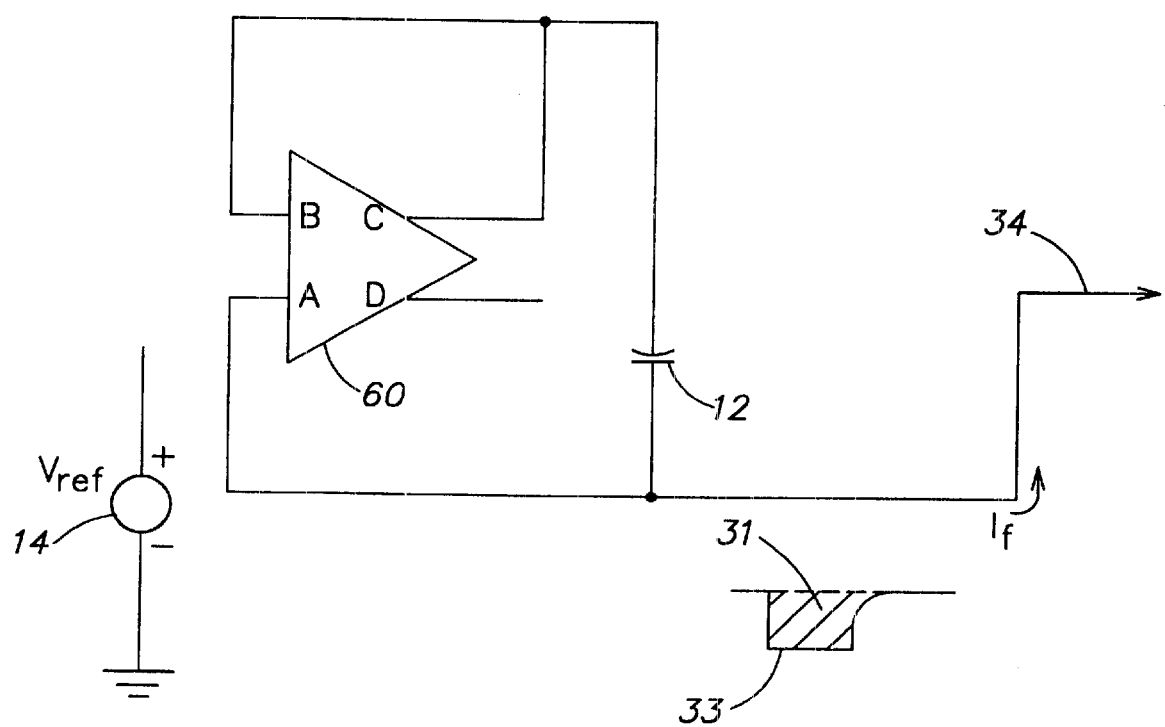
Figure 10:
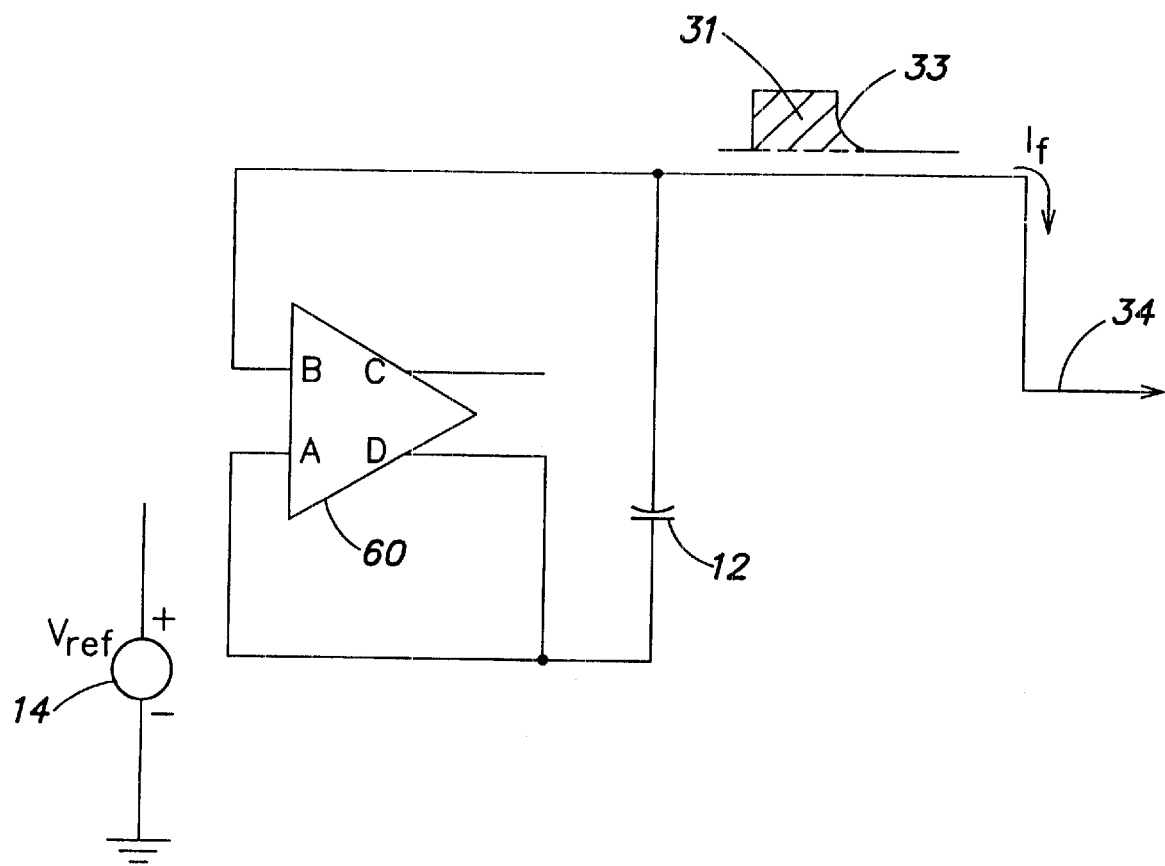

FIGS. 8–10 are simplified diagrams of the charge transfer circuit 104 shown in FIG. 7, illustrating various operating modes of the modified buffer amplifier 60 and the charge transfer circuit 104 during respective preset and transfer intervals for different states of the digital control signal 44. For clarity of illustration, the switches S6–S12 are not explicitly shown in FIGS. 8–10; rather, only the connections made by the switches during a particular mode of operation are shown.

FIG. 8 shows the configuration of the charge transfer circuit 104 during the preset interval, for either a logic low or logic high state of the digital control signal 44; accordingly, as discussed above, it should be appreciated that the charge transfer circuit 104 of FIG. 7 charges the capacitor 12 in a similar manner during each preset interval, regardless of the state of the digital control signal 44. In one embodiment, the charge control circuit 116 maintains the buffer select signal 62 in a high logic state during each preset interval, which results in the modified buffer amplifier 60 being configured similar to the buffer amplifier 50 shown in FIG. 5, in which terminal A is the non-inverting input and an output of the amplifier 60 is taken from terminal C, as shown in FIG. 8. As discussed above, while the switches S6–S12 themselves are omitted for clarity in FIG. 8, it is to be understood that during the preset interval, typically the switches S6, S7, and S11 are "closed," while the switches S8, S9, S10, and S12 are "open."

FIGS. 9 and 10 show two possible configurations of the charge transfer circuit 104 during the transfer interval, each figure corresponding to one of two possible states of the digital control signal 44. For example, given a particular polarity of the reference voltage $V_{ref}$, in one state of the digital control signal 44, the charge transfer circuit 104 transfers charge to a load by virtue of a positive current pulse on the charge transfer signal 34, and in the other state of the digital control signal 44 the charge transfer circuit 104 draws charge from the load by virtue of a negative current pulse on the charge transfer signal 34.

In the example configurations shown in FIGS. 9 and 10, for purposes of illustration it is assumed that the reference voltage $V_{ref}$ has a positive polarity during the preset interval (as shown in FIG. 8), a logic high state of the digital control signal 44 causes the charge transfer circuit 104 to transfer charge to a load (output a positive current pulse on the charge transfer signal 34), and that a logic low state of the digital control signal 44 causes the charge transfer circuit 104 to draw charge from the load (output a negative current pulse on the charge transfer signal 34). It should be appreciated that the foregoing relationship between the logic state of the digital control signal 44, the logic state of the buffer mode select signal 62 derived therefrom, and the polarity of the charge transfer signal 34 are shown for purposes of illustration only, and that other relationships between these signals are possible according to other embodiments of the invention.

In the example configuration shown in FIG. 9, during the transfer interval, a logic high digital control signal 44 causes the charge control circuit 116 to output a buffer mode select signal 62 in a logic high state, thereby configuring the modified buffer amplifier 60 as shown in FIG. 8, with the terminal C serving as an output of the amplifier 60. Additionally, for a logic high digital control signal 44, the charge control circuit 116 maintains the switches S6, S7, S10, and S12 "open," and the switches S8, S9, and S11 "closed." In this manner, the capacitor 12 discharges through the modified buffer amplifier 60 such that a negative current pulse 33, drawing the charge 31 from a load, results on the charge transfer signal 34.

Alternatively, in the example configuration shown in FIG. 10, for a logic low digital control signal 44 during the transfer interval, the charge control circuit 116 outputs a logic low buffer mode select signal 62, thereby configuring the modified buffer amplifier 60 such that its inputs are inverted with respect to the configuration shown in FIG. 8 and its output is taken from the terminal D, as discussed above in connection with FIG. 6. Additionally, for a logic low digital control signal 44, the charge control circuit 116 maintains the switches S6, S7, S9, and S11 "open," and the switches S8, S10, and S12 "closed." In this manner, the capacitor 12 discharges through the modified buffer amplifier 60 such that a positive current pulse 33, transferring the charge 31 to a load, results on the charge transfer signals 34.

Figure 11:
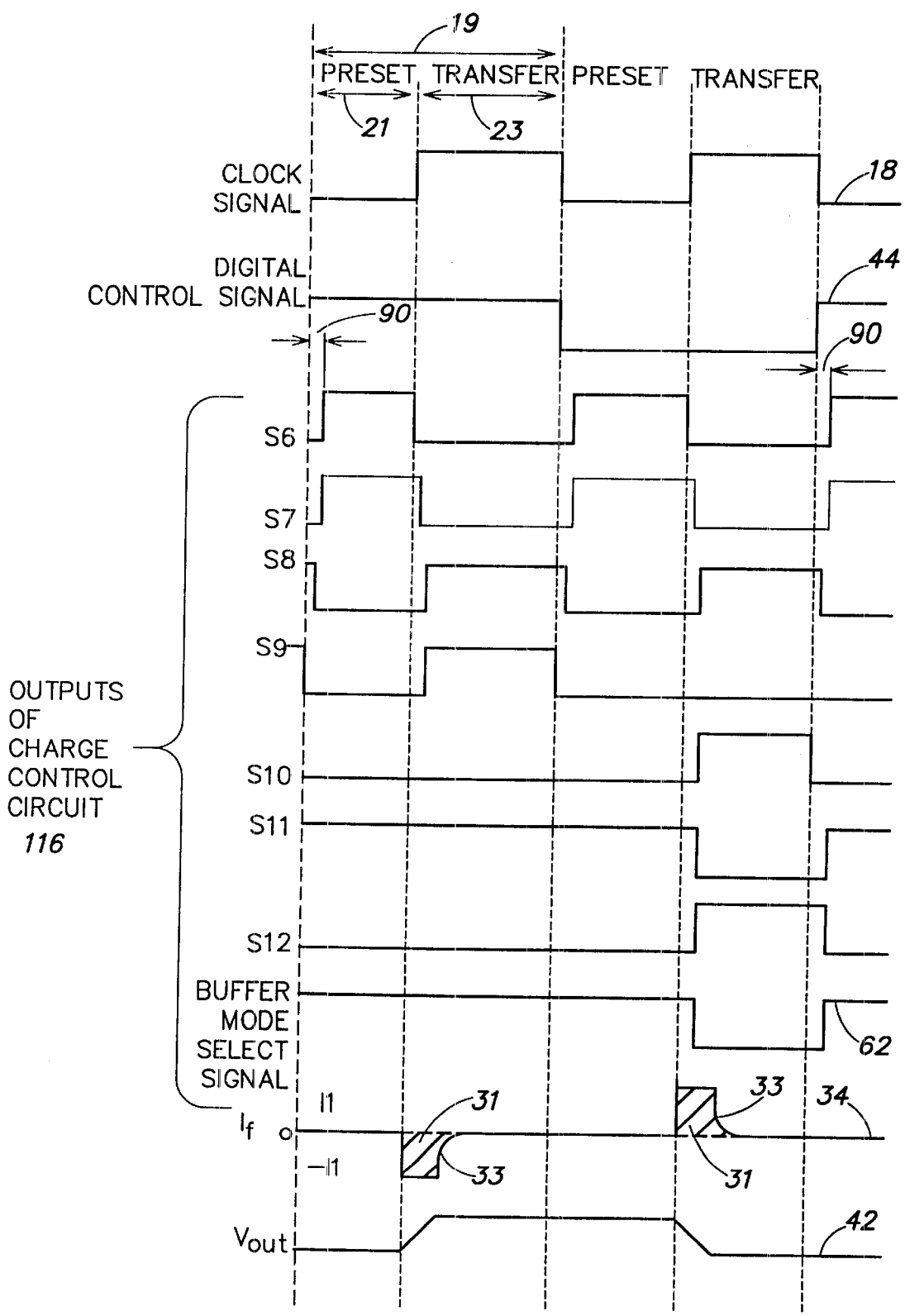
FIG. 11 is a timing diagram showing a relative timing of various signals associated with the charge transfer circuit of FIG. 7.

FIG. 11 shows a timing diagram of various signals used to operate the charge transfer circuit 104 of FIG. 7, according to the exemplary configurations illustrated in FIGS. 8–10 corresponding to the preset and transfer intervals for different states of the digital control signal 44. In FIG. 11, the clock signal 18 is shown for more than two full periods 19, namely, for first preset and transfer intervals followed by second preset and transfer intervals. During the first preset and transfer intervals, the digital control signal 44 is in a logic high state, and during the second preset and transfer intervals, the digital control signal 44 is in a logic low state. The output signals of the charge control circuit 116, namely the signals controlling the switches S6–S12 and the buffer mode select signal 62, are each derived from the clock signal 18 and the digital control signal 44. In FIG. 11, with reference to FIGS. 7–10, for the signals controlling the switches S6–S12, a logic high state indicates that the respective switch is "closed," while a logic low state indicates that the respective switch is "open."

As discussed above in connection with FIGS. 8–10 and as illustrated in FIG. 11, for each preset interval, irrespective of the digital control signal 44, the charge control circuit 116 outputs signals to control the switches S6–S12 so as to maintain the switches S6, S7 and S11 "closed," as indicated by the logic high levels of the corresponding control signals, and so as to maintain the switches S8, S9, S10, and S12 "open," as indicated by the logic low levels of the corresponding control signals.

In FIG. 11, during the first transfer interval while the digital control signal is in a logic high state, the charge control circuit 116 opens switches S6 and S7 and closes switches S8 and S9 so as to output a negative current pulse 33 ($I_f$) drawing charge 31 from a load via the charge control signal 34. FIG. 11 also shows an output signal 42 of the integrating amplifier of a sigma-delta modulator, as shown in FIG. 3, employing the charge transfer circuit 104 of FIG. 7. With reference to FIG. 3, during the first transfer interval shown in FIG. 11, the output signal 42 ($V_{out}$) is shown as having a positive slope as the charge 31 is transferred from the integrating capacitor 38 to the charge transfer circuit 104.

In contrast, during the second transfer interval shown in FIG. 11, while the digital control signal is in a logic low state, the charge control circuit 116 opens switches S6, S7, and S11 and closes switches S8, S10, and S12 so as to output a positive current pulse 33 transferring charge 31 to a load via the charge control signal 34. FIG. 11 also shows that the output signal 42 of the integrating amplifier of a sigma-delta modulator, as shown in FIG. 3, employing the charge transfer circuit 104 of FIG. 7, has a negative slope as the charge 31 is transferred to the integrating capacitor 38 from the charge transfer circuit 104. In the embodiment of FIG. 7, as illustrated by the charge control signal 34 ($I_f$) in FIG. 11, it should be appreciated that the charge transfer circuit 104 transfers essentially identical quantities of charge 31, based on the reference signal 15, during each transfer interval, albeit with different polarities (either to or from the load).

As illustrated in FIG. 11, it should be noted that according to one embodiment of the charge transfer circuit 104 of FIG. 7, at the end of the transfer intervals near a falling edge of the clock signal 18, the switches S9 or S10, whichever has been closed, are opened first by the charge control circuit 116, before any other switches are controlled. The other switches are subsequently controlled, as required to return to the preset mode, after a short delay (as shown, for example, by the delay 90 in the control signal for switch S6), to provide for well-defined sampling of the reference signal 15. Additionally, during the transfer intervals, the charge control circuit 116 generally opens the switch S6 slightly before the switch S7 to further provide for well-defined sampling of the reference signal 15. It is also noteworthy that, to avoid shorting the reference signal 15 to a ground potential, the charge control circuit 116 opens the switch S8 before closing the switches S6 and S7 during the preset intervals.

For embodiments of the invention in which the charge transfer circuit 104 of FIG. 7 is employed in a sigma-delta modulator, as shown in FIG. 3, a potential source of small errors in the charge 31, transferred as a representative "sample" of the reference signal 15 ($V_{ref}$), may be due to capacitances between the terminals of any MOS transistors employed as the switches S6–S10. While the discussion below focusses around the switch S9 for purposes of illustration, it should be appreciated that the concepts outlined below may be relevant to any of the switches S6–S12 of the charge transfer circuit 104 shown in FIG. 7.

Figure 12:
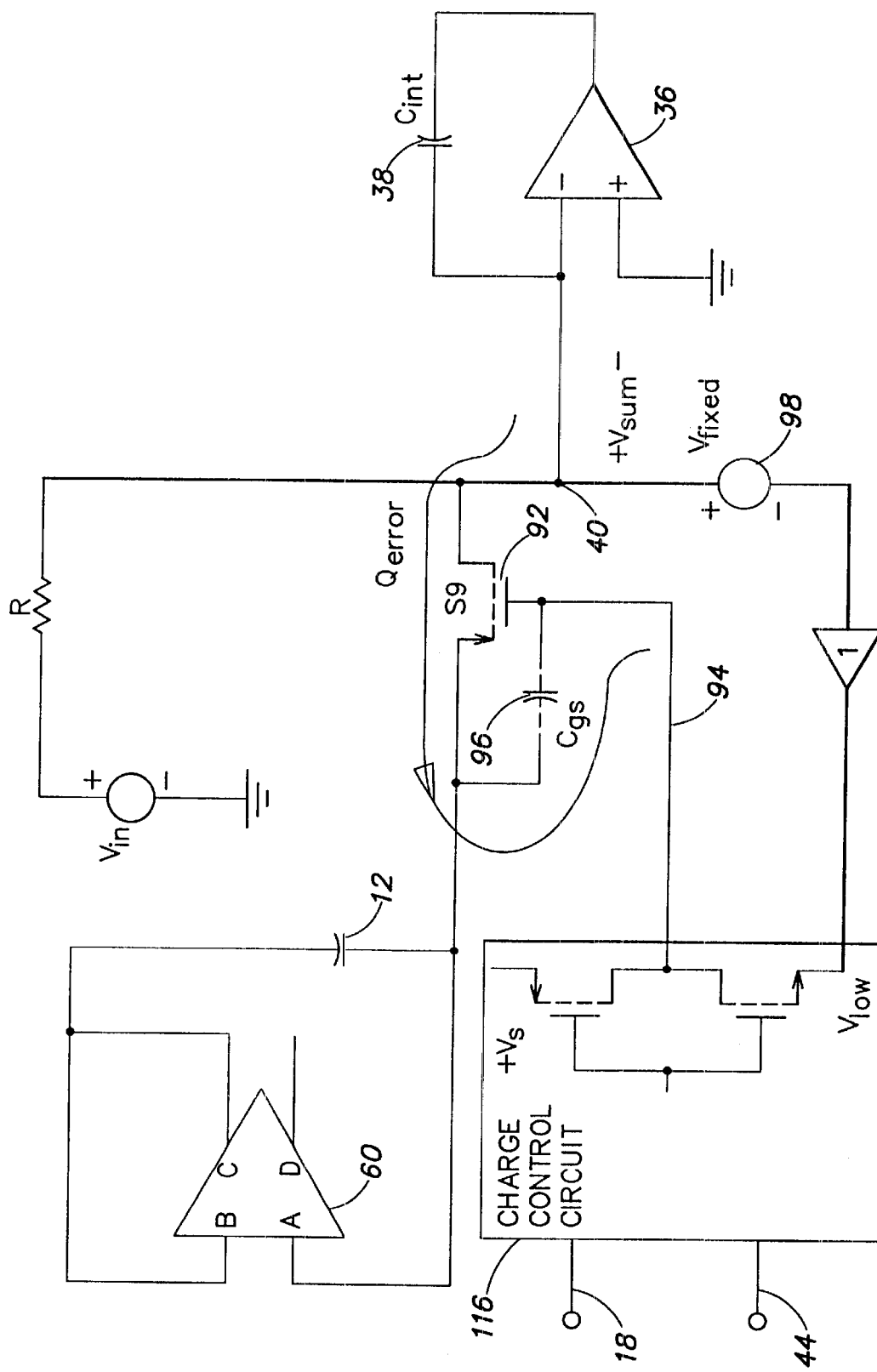
FIG. 12 is a diagram of a charge transfer circuit having a bootstrapped switch drive, according to one embodiment of the invention.

FIG. 12 is a diagram similar to FIG. 9, in which the charge 31 is drawn from a load (in this case, the summing node 40 of the integrating amplifier 36) through the closed switch S9. In FIG. 12, the switch S9 is shown as PMOS transistor 92, controlled by a control signal 94 output by the charge control circuit 116 and applied to a gate terminal of the transistor 92. The control signal 94 generally has one of two logic states, namely, a logic low state typically at or near the negative power supply level and a logic high state at or near the positive power supply level +$V_s$, as shown schematically in FIG. 12 by a CMOS output stage of the charge control circuit 116. As discussed above in connection with FIG. 11, the switch S9 is closed for a corresponding logic low control signal 94 output by the charge control circuit 116. Accordingly, as shown in FIG. 12, the transistor 92 conducts (the switch S9 is closed) when a logic low control signal 94 is applied to the gate terminal of the transistor 92. FIG. 12 also shows a gate-source capacitance 96 ($C_{gs}$) associated with the PMOS transistor 92.

As shown in FIG. 12, in addition to any charge stored on the capacitor 12 representing the reference signal 15, during the transfer interval the charge transfer circuit 104 may transfer charge between the integration capacitor 38 and the gate-source capacitance 96 of the PMOS transistor 92 serving as the switch S9. When the switch S9 opens quickly at the end of the transfer interval, this "error" charge due to the gate-source capacitance 96 may be "trapped" in the integration capacitor 38. This error charge may be expressed as $Q_{error}=(V_{sum}-V_{tp}-V_{low})C_{gs}$, where $V_{sum}$ is the voltage of the summing node 40, $V_{tp}$ is a threshold voltage of the PMOS transistor 92, $V_{low}$ is the voltage of the logic low control signal, and $C_{gs}$ is the gate-source capacitance 96. Since the voltage $V_{sum}$ at the summing node 40 depends on the variable input voltage $V_{in}$, as a result an unpredictable and undesirable variable charge error $Q_{error}$ may be introduced by the transistor gate-source capacitance 96 due to the varying voltage $V_{sum}$.

One solution to the potential problem of a variable charge error due to transistor terminal capacitances, according to one embodiment of the invention, is to derive the logic low state of the control signal 94 (which controls the transistor 92) from the summing node voltage $V_{sum}$. For example, as shown in FIG. 12, the voltage of the logic low state may be derived from a fixed voltage source 98, having a voltage $V_{fixed}$, coupled to the summing node 40. In this manner, any charge $Q_{error}$ trapped in the integrating capacitor 38 when the transistor 92 ceases to conduct (the switch S9 opens) is made independent of the summing node voltage $V_{sum}$; in particular, the charge $Q_{error}$ would then be given by $Q_{error}=(V_{fixed}-V_{tp})C_{gs}$.

Figure 13:
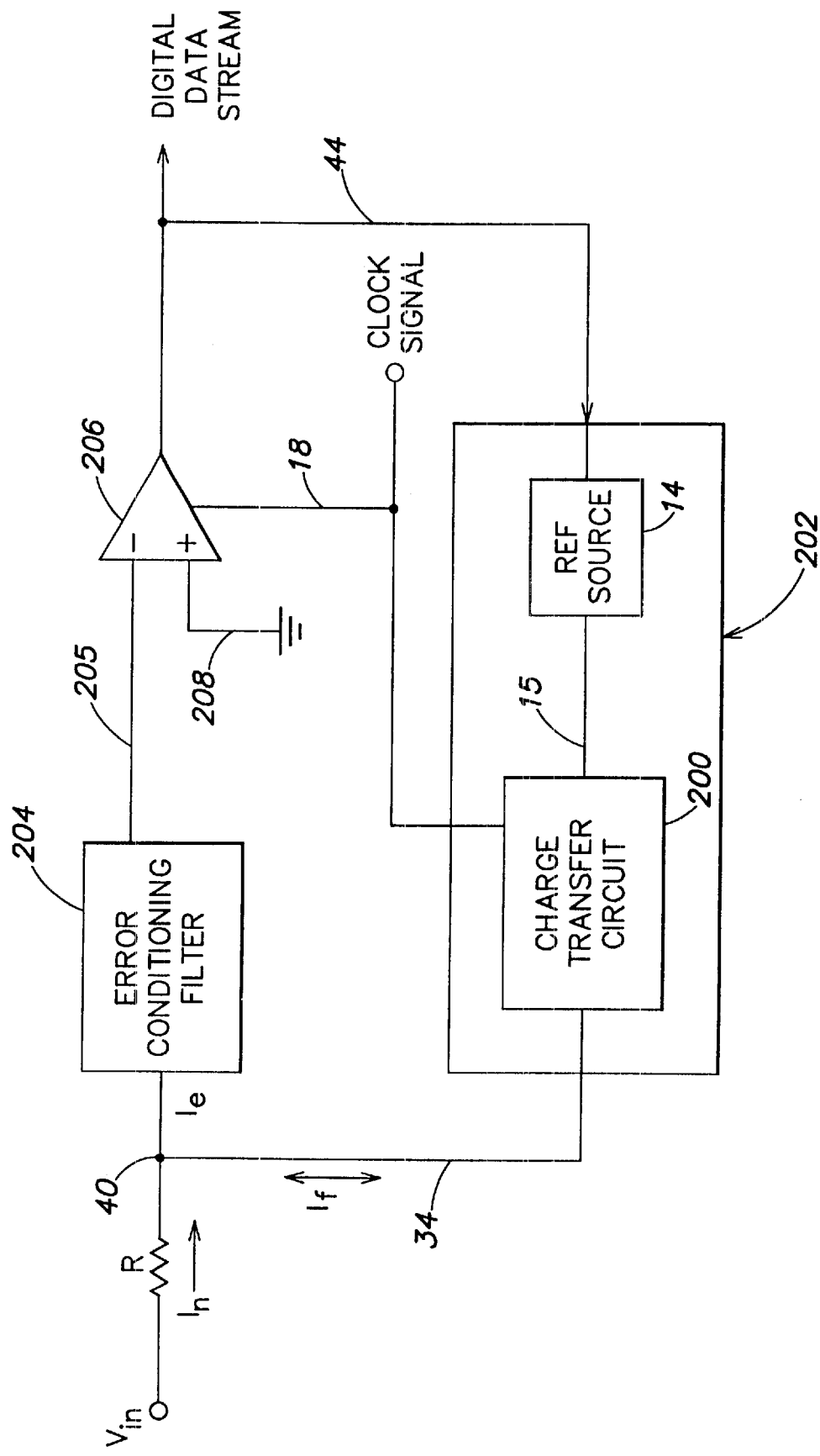
FIG. 13 is a diagram of an analog-to-digital converter employing a charge transfer circuit to provide quantized feedback, according to one embodiment of the invention.

FIG. 13 is a diagram of a sigma-delta analog-to-digital converter employing a charge transfer circuit to provide quantized feedback, according to one embodiment of the invention. In FIG. 13, a charge transfer circuit 200, together with reference source 14, forms a quantized feedback filter 202 for the analog-to-digital converter. It should be appreciated that the charge transfer circuit 200 may include any of the foregoing embodiments of charge transfer circuits described in connection with FIGS. 3, 4, and 7 (charge transfer circuits 100, 102, and 104), as well as other implementations of a charge transfer circuit according to the invention not explicitly discussed herein.

In the sigma-delta analog-to-digital converter of FIG. 13, the integrating amplifier 36 shown, for example, in FIG. 3, may be included as part of an error conditioning filter 204 which outputs a conditioned error signal 205 based on the input signal $V_{in}$ and the charge transfer signal 34. The conditioned error signal 205 is applied to a comparator 206 controlled by the clock signal 18. The comparator 206 periodically compares, based on the clock signal, the conditioned error signal 205 to a predetermined threshold value 208, for example a ground potential as shown in FIG. 13. As a result of the comparison, the comparator 206 outputs the digital control signal 44, for example, as a digital data stream, which serves both as an input to the quantized feedback filter 202 (and, in particular, the reference source 14), as well as an output of the analog-to-digital converter.

The quantized feedback filter 202 of FIG. 13, and in particular the charge transfer circuit 200, function in a manner similar to that described above in connection with FIGS. 3, 4, and 7. Specifically, the quantized feedback filter 202 outputs a charge transfer signal 34 carrying a quantity of charge to or from the summing node 40, wherein the quantity of charge is significantly insensitive to variations in the period of the clock signal 18, and significantly insensitive to the input signal $V_{in}$ as well as any performance limitations of the error conditioning filter 204, such as, for example, a maximum current capability or a limited slew rate of any operational amplifiers included within the error conditioning filter 204.

Figure 14:
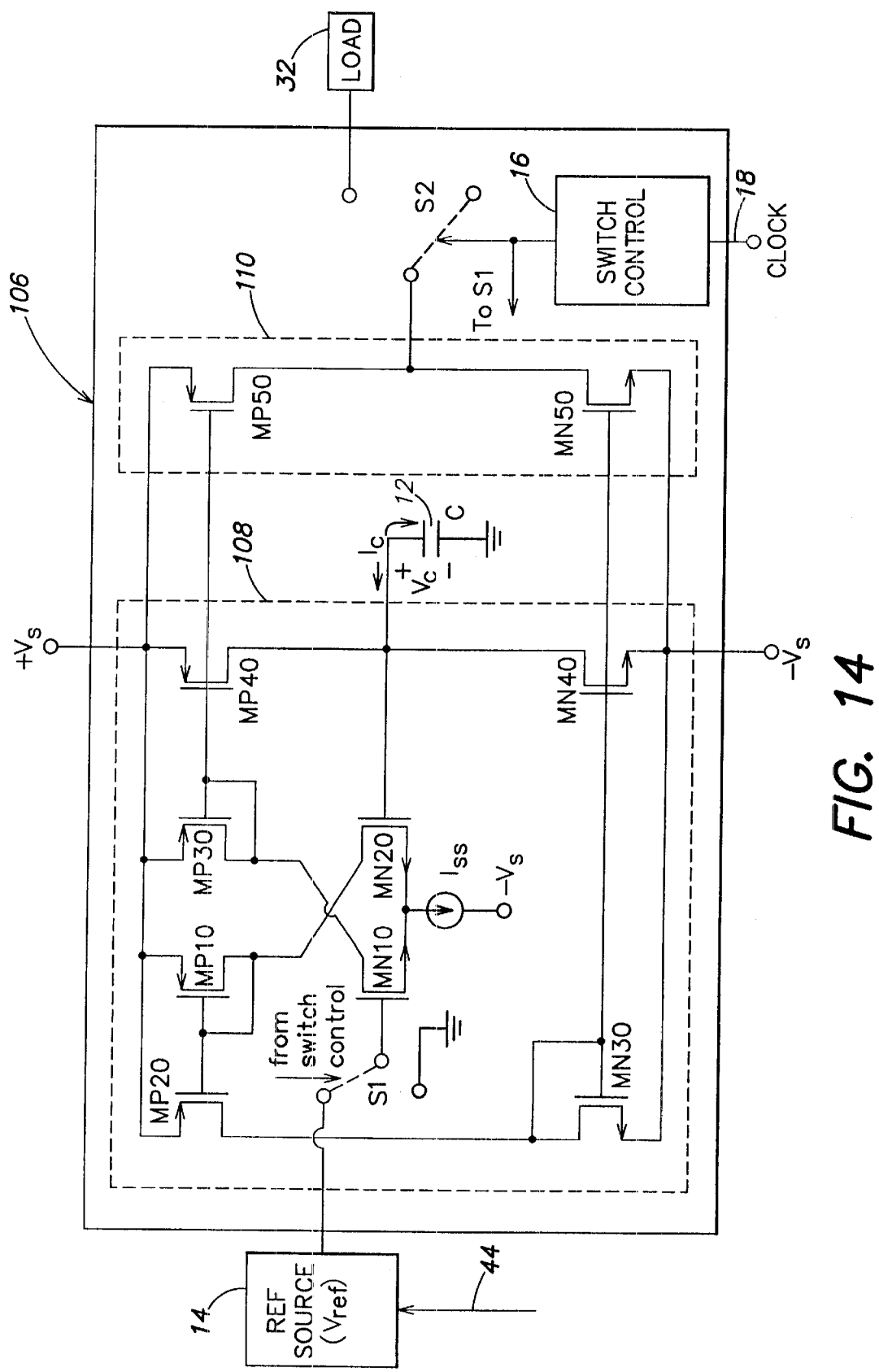
FIG. 14 is a diagram of a charge transfer circuit suitable for driving a high impedance load, according to one embodiment of the invention.

FIG. 14 is a diagram of a charge transfer circuit 106 suitable for driving a high impedance load, according to one embodiment of the invention. Rather than relying on a "bootstrapping" configuration, as described in connection with FIGS. 3, 4, and 7, to address the problem of load characteristics undesirably affecting the amount of charge transferred to or from the load 32, the charge transfer circuit 106 instead uses an output isolation stage, formed by, for example, current mirrors, to isolate the charge storage element (for example, the capacitor 12) from the load.

In the circuit of FIG. 14, during the preset interval, the capacitor 12 is charged by a high-impedance amplifier 108 that includes an input differential pair, formed by NMOS transistors MN10 and MN20, biased by current source $I_{ss}$. The high-impedance amplifier 108 also includes current mirror pairs formed by MOS transistors MP10 and MP20, MP30 and MP40, and MN30 and MN40.

During the preset interval, the amplifier 108 is connected as shown in FIG. 14 to the reference source 14 through the switch S1, and the load 32 is not connected to the circuit 106. During the transfer interval, an input of the amplifier 108 is coupled to a ground potential through the switch S1, and the load 32 is coupled to the circuit 106 through the switch S2. The load 32, however, is isolated from the capacitor 12 by a high-impedance output stage 110 formed by MOS transistors MP50 and MN50. The load 32 receives a "replica" of the capacitor current $I_c$ from the transistors MP50 and MN50, which mirror the currents through MP40 and MN40, respectively.

In FIG. 14, the capacitor current $I_c$ is limited by the high-impedance amplifier 108 to a maximum value determined by the bias current source $I_{ss}$ (assuming that all of the current mirrors have a gain of approximately one). Accordingly, the high-impedance amplifier 108 limits the current transferring the charge in a manner similar to that of the buffer amplifiers 50 and 60 discussed above in connection with FIGS. 3, 4, and 7. The charge transfer circuit 106 transfers charge to and from the load significantly independently of any voltage across the load by virtue of the high output impedance of the output stage 110 formed by transistors MP50 and MN50. While not explicitly shown in FIG. 14, the impedance of the output stage 110 may be enhanced by cascoding techniques, as should be readily apparent to those skilled in the art.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting.

What is claimed is:

1. A charge transfer circuit to transfer a quantity of charge one of to and from a load, the charge transfer circuit comprising:

a clock input to receive a clock signal having a period, a portion of the period defining a transfer interval; and at least one reference input to receive at least one reference signal, wherein:

the quantity of charge is based on the at least one reference signal; and the charge transfer circuit is adapted to transfer the quantity of charge during the transfer interval such that the quantity of charge is significantly insensitive to variations in the transfer interval and at least some load characteristics, wherein the at least some load characteristics include at least one of a load voltage, a load impedance, an input signal coupled to the load, a slew rate of the load, and a maximum current capability of the load.

2. The charge transfer circuit of claim 1, wherein:
the at least some load characteristics include the load voltage; and
the charge transfer circuit is adapted to transfer the quantity of charge during the transfer interval such that the quantity of charge is significantly insensitive to the load voltage.

3. The charge transfer circuit of claim 1, wherein:
the at least some load characteristics include the load impedance; and
the charge transfer circuit is adapted to transfer the quantity of charge during the transfer interval such that the quantity of charge is significantly insensitive to the load impedance.

4. The charge transfer circuit of claim 1, wherein:
the at least some load characteristics include the input signal coupled to the load; and
the charge transfer circuit is adapted to transfer the quantity of charge during the transfer interval such that the quantity of charge is significantly insensitive to input signal.

5. The charge transfer circuit of claim 1, wherein:
the clock signal defines a succession of transfer intervals; and
the charge transfer circuit transfers an essentially identical quantity of charge during each transfer interval of the succession of transfer intervals.

6. The charge transfer circuit of claim 1, wherein:
the charge transfer circuit transfers the quantity of charge as a current pulse having a pulse width that is less than the transfer interval; and
the at least one reference signal determines a maximum amplitude and a polarity of the current pulse.

7. The charge transfer circuit of claim 6, wherein:
the load includes circuitry having a maximum current capability; and
the maximum amplitude of the current pulse is less than the maximum current capability of the load circuitry.

8. The charge transfer circuit of claim 1, wherein the charge transfer circuit further includes:
a charge storage circuit; and
a charge control circuit coupled to the charge storage circuit and including the clock input to receive the clock signal, wherein:
the charge control circuit couples the at least one reference signal to the charge storage circuit during a preset interval to charge the charge storage circuit to the quantity of charge, the preset interval being defined by another portion of the period of the clock signal not including the transfer interval; and
the charge control circuit couples the charge storage circuit to the load during the transfer interval to transfer the quantity of charge between the charge storage circuit and the load.

9. A charge transfer circuit to transfer a quantity of charge one of to and from a load, de charge transfer circuit comprising:
a clock input to receive a clock signal having a period, a portion of the period defining a transfer interval; and
at least one reference input to receive at least one reference signal,
wherein:
the quantity of charge is based on the at least one reference signal; and
the charge transfer circuit is adapted to transfer the quantity of charge during the transfer interval such that the quantity of charge is significantly insensitive to variations in the transfer interval and at least some load characteristics,
wherein the charge transfer circuit further includes:
a charge storage circuit; and
a charge control circuit coupled to the charge storage circuit and including the clock input to receive the clock signal,
wherein:
the charge control circuit is adapted to couple the at least one reference signal to the charge storage circuit during a preset interval to charge the charge storage circuit to the quantity of charge, the preset interval being defined by another portion of the period of the clock signal not including the transfer interval; and
the charge control circuit is adapted to couple the charge storage circuit to the load during the transfer interval to transfer the quantity of charge between the charge storage circuit and the load,
wherein the charge storage circuit includes:
at least one capacitor; and
a buffer amplifier coupled to the at least one capacitor.

10. The charge transfer circuit of claim 9, wherein:
the buffer amplifier has a maximum output current; and
the maximum amplitude of the current pulse is based on the maximum output current of the buffer amplifier.

11. The charge transfer circuit of claim 9, wherein:
an input signal is coupled to the load; and
a final voltage across the capacitor during the transfer interval is significantly insensitive to the input signal.

12. The charge transfer circuit of claim 9, wherein:
the buffer amplifier has an input offset voltage; and
a final voltage across the capacitor during the transfer interval is based on the input offset voltage of the buffer amplifier.

13. The charge transfer circuit of claim 9, further including a first plurality of switches coupled to the charge storage circuit and responsive to the charge control circuit.

14. The charge transfer circuit of claim 13, wherein:
the charge control circuit operates the first plurality of switches so as to couple the at least one capacitor and the buffer amplifier to the at least one reference signal during the preset interval, such that the at least one capacitor is charged with the quantity of charge through the buffer amplifier; and
the charge control circuit operates the first plurality of switches so as to couple the at least one capacitor and the load to the buffer amplifier during the transfer interval, such that the quantity of charge is transferred between the at least one capacitor and the load through the buffer amplifier.

15. The charge transfer circuit of claim 13, wherein:
the charge control circuit operates the first plurality of switches so as to couple the at least one capacitor directly to the at least one reference signal during the preset interval, such that the at least one capacitor is charged with the quantity of charge directly from the at least one reference signal; and the charge control circuit operates the first plurality of switches so as to couple the at least one capacitor and the load to the buffer amplifier during the transfer interval, such that the quantity of charge is transferred between the at least one capacitor and the load through the buffer amplifier.

16. The charge transfer circuit of claim 13, wherein the buffer amplifier is an operational transconductance amplifier.

17. The charge transfer circuit of claim 13, wherein the buffer amplifier is a reconfigurable buffer amplifier.

18. The charge transfer circuit of claim 17, wherein the reconfigurable buffer amplifier includes a second plurality of switches responsive to a buffer mode select signal, so as to reconfigure inputs and outputs of the reconfigurable operational amplifier.

19. The charge transfer circuit of claim 18, wherein:

the at least one reference signal has a first polarity; and the charge control circuit operates the first plurality of switches so as to couple the at least one capacitor and the reconfigurable buffer amplifier to the at least one reference signal during the preset interval, such that the at least one capacitor is charged with the quantity of charge through the reconfigurable buffer amplifier; and the charge control circuit operates the first plurality of switches so as to couple the at least one capacitor and the load to the reconfigurable buffer amplifier during the transfer interval, such that the quantity of charge is transferred between the at least one capacitor and the load through the reconfigurable buffer amplifier, the quantity of charge having one of the first polarity and a second polarity based on the buffer mode select signal.

20. The charge transfer circuit of claim 13, wherein the charge control circuit and the first plurality of switches include MOS transistors.

21. The charge transfer circuit of claim 20, wherein:

an input signal is coupled to the load;

the charge control circuit outputs a control signal to at least one switch of the first plurality of switches, the control signal having a first logic state and a second logic state; and at least one of the first logic state and the second logic state is based on the input signal.

22. The charge transfer circuit of claim 13, wherein the charge transfer circuit is fabricated as a monolithic integrated circuit.

23. The charge transfer circuit of claim 9, wherein the buffer amplifier includes:

a high-impedance amplifier to charge the at least one capacitor based on the at least one reference signal; and an output isolation stage to isolate the at least one capacitor from the load, the output isolation stage transferring the quantity of charge between the at least one capacitor and the load as a replica current of a capacitor current of the at least one capacitor.

24. The charge transfer circuit of claim 23, wherein the output isolation stage has a high output impedance.

25. The charge transfer circuit of claim 1, wherein:

the at least some load characteristics include the slew rate of the load; and the charge transfer circuit is adapted to transfer the quantity of charge during the transfer interval such that the quantity of charge is significantly insensitive to the slew rate.

26. The charge transfer circuit of claim 1, wherein:

the at least some load characteristics include the maximum current capability of the load; and the charge transfer circuit is adapted to transfer the quantity of charge during the transfer interval such that the quantity of charge is significantly insensitive to the maximum current capability.

27. A charge transfer method, comprising a step of transferring a quantity of charge one of to and from a load during a transfer interval, the quantity of charge being significantly insensitive to the transfer interval and at least some load characteristics, wherein the at least some load characteristics include at least one of a load voltage, a load impedance, an input signal coupled to the load, a slew rate of the load, and a maximum current capability of the load.

28. The method of claim 27, wherein the step of transferring comprises a step of transferring a plurality of quantities of charge, each quantity of charge being essentially identical.

29. The method of claim 27, wherein the step of transferring comprises a step of applying a current pulse to the load, the current pulse having a pulse width that is less than the transfer interval.

30. The method of claim 29, wherein:

the load includes circuitry having a maximum current capability; and the step of applying a current pulse includes a step of applying a current pulse having a maximum amplitude that is less than the maximum current capability of the load circuitry.

31. The method of claim 27, wherein the step of transferring includes steps of:

storing the quantity of charge during a preset interval, the quantity of charge being based on at least one reference signal.

32. The method of claim 31, wherein the preset interval is nonoverlapping with the transfer interval.

33. The method of claim 31, wherein:

the at least some load characteristics include the input signal coupled to the load; and the step of transferring further includes a step of transferring the quantity of charge such that the quantity of charge is significantly insensitive to the input signal.

34. A charge transfer method, comprising a step of transferring a quantity of charge one of to and from a load during a transfer interval, the quantity of charge being significantly insensitive to the transfer interval and at least some load characteristics, wherein the step of transferring includes a step of:

storing the quantity of charge during a preset interval, the quantity of charge being based on at least one reference signal, and wherein:

an input signal is coupled to the load; and the step of transferring further includes a step of transferring the quantity of charge such that the quantity of charge is significantly insensitive to the input signal, and wherein:

the step of storing the quantity of charge includes a step of charging at least one capacitor with the quantity of charge; and the step of transferring the quantity of charge further includes a step of discharging the capacitor to a final voltage that is significantly insensitive to the input signal.

35. The method of claim 31, wherein:

the step of storing the quantity of charge includes a step of storing a plurality of quantities of charge during a succession of preset intervals, each quantity of charge being stored during a respective preset interval of the succession of preset intervals; and the step of transferring the quantity of charge includes a step of transferring the plurality of quantities of charge during a succession of transfer intervals, each quantity of charge being transferred during a respective transfer interval of the succession of transfer intervals, the succession of preset intervals and transfer intervals being arranged as non-overlapping alternating intervals.

36. The method of claim 35, wherein the step of storing the plurality of quantities of charge includes a step of storing each quantity of charge of the plurality of quantities of charge during the respective preset interval after a short delay following an end of a previous transfer interval adjacent to the respective preset interval.

37. The method of claim 27, wherein:

the at least some load characteristics include the load voltage; and the step of transferring a quantity of charge includes a step of transferring the quantity of charge such that the quantity of charge is significantly insensitive to the load voltage.

38. The method of claim 27, wherein:

the at least some load characteristics include the load impedance; and the step of transferring a quantity of charge includes a step of transferring the quantity of charge such that the quantity of charge is significantly insensitive to the load impedance.

39. The method of claim 27, wherein:

the at least some load characteristics include the input signal coupled to the load; and the step of transferring a quantity of charge includes a step of transferring the quantity of charge such that the quantity of charge is significantly insensitive to the input signal.

40. The method of claim 27, wherein:

the at least some load characteristics include the slew rate of the load; and the step of transferring a quantity of charge includes a step of transferring the quantity of charge such that the quantity of charge is significantly insensitive to the slew rate.

41. The method of claim 27, wherein:

the at least some load characteristics include the maximum current capability of the load; and the step of transferring a quantity of charge includes a step of transferring the quantity of charge such that the quantity of charge is significantly insensitive to the maximum current capability.

42. A charge transfer circuit to transfer a quantity of charge between the charge transfer circuit and a continuous-time integrating circuit, the charge transfer circuit comprising:

a reference input to receive at least one reference voltage;

at least one capacitor to store the quantity of charge based on the at least one reference voltage;

a buffer amplifier; and a first plurality of switches to couple in a predetermined manner the at least one capacitor and the buffer amplifier to the reference input and the continuous-time integrating circuit such that the at least one capacitor is at least one of charged and discharged through the buffer amplifier.

43. The charge transfer circuit of claim 42, further including a charge control circuit to control the first plurality of switches, wherein:

the charge control circuit receives a clock signal having a period; and the charge control circuit controls the first plurality of switches based on the clock signal.

44. The charge transfer circuit of claim 43, wherein:

an input signal is coupled to the continuous-time integrating circuit;

the charge control circuit outputs a control signal to at least one switch of the first plurality of switches, the control signal having a first logic state and a second logic state; and at least one of the first logic state and the second logic state is based on the input signal.

45. The charge transfer circuit of claim 43, wherein:

the charge control circuit controls the first plurality of switches such that the reference input is coupled to the at least one capacitor during a preset interval of the clock signal to charge the at least one capacitor to the quantity of charge, the preset interval being defined by a portion of the period of the clock signal; and the charge control circuit controls the first plurality of switches such that the at least one capacitor is coupled to the continuous-time integrating circuit during a transfer interval of the clock signal to transfer the quantity of charge between the at least one capacitor and the continuous-time integrating circuit, the transfer interval being defined by another portion of the period of the clock signal not including the preset interval.

46. The charge transfer circuit of claim 45, wherein the charge control circuit controls the first plurality of switches such that the at least one capacitor is charged with the quantity of charge during the preset interval through the buffer amplifier, and such that the quantity of charge is transferred during the transfer interval between the at least one capacitor and the continuous-time integrating circuit through the buffer amplifier.

47. The charge transfer circuit of claim 45, wherein the charge control circuit controls the first plurality of switches so as to couple the at least one capacitor directly to the reference input to charge the at least one capacitor with the quantity of charge directly from the reference input during the preset interval, and such that the quantity of charge is transferred during the transfer interval between the at least one capacitor and the continuous-time integrating circuit through the buffer amplifier.

48. The charge transfer circuit of claim 45, wherein the buffer amplifier is a reconfigurable buffer amplifier.

49. The charge transfer circuit of claim 48, wherein the reconfigurable buffer amplifier includes a second plurality of switches responsive to a buffer mode select signal, so as to reconfigure inputs and outputs of the reconfigurable operational amplifier.

50. The charge transfer circuit of claim 49, wherein:

the at least one reference voltage has a first polarity;

the charge control circuit controls the first plurality of switches so as to couple the at least one capacitor and the reconfigurable buffer amplifier to the reference input during the preset interval, such that the at least one capacitor is charged with the quantity of charge through the reconfigurable buffer amplifier; and the charge control circuit controls the first plurality of switches so as to couple the at least one capacitor and the continuous-time integrating circuit to the reconfigurable buffer amplifier during the transfer interval, such that the quantity of charge is transferred between the at least one capacitor and the continuous-time integrating circuit through the reconfigurable buffer amplifier, the quantity of charge having one of the first polarity and a second polarity opposite to the first polarity based on the buffer mode select signal.

51. The charge transfer circuit of claim 49, wherein the charge control circuit, the first plurality of switches, and the second plurality of switches include MOS transistors.

52. The charge transfer circuit of claim 49, wherein the charge transfer circuit is fabricated as a monolithic integrated circuit.

* * * * *

UNITED STATES PATENT AND TRADEMARK OFFICE
CERTIFICATE OF CORRECTION

PATENT NO.    : 6,452,531 B1
DATED         : September 17, 2002
INVENTOR(S)   : Gerald A. Miller and Michael C.W. Coln It is certified that error appears in the above-identified patent and that said Letters Patent is hereby corrected as shown below:

<u>Title page,</u>
Item [73] should read as follows:
-- [73] Analog Devices, Inc., Norwood MA (US) --

<u>Column 21,</u>
Line 26, please replace "input signal" with -- the input signal --.
Line 62, please replace "de" with -- the --.

Signed and Sealed this

Twenty-eighth Day of January, 2003

JAMES E. ROGAN
*Director of the United States Patent and Trademark Office*